United States Patent
Parham et al.

(10) Patent No.: US 7,834,136 B2
(45) Date of Patent: Nov. 16, 2010

(54) CONJUGATED POLYMERS AND BLENDS CONTAINING CARBAZOLE, REPRESENTATION AND USE THEREOF

(75) Inventors: Amir Parham, Frankfurt (DE); Aurelie Falcou, Frankfurt (DE); Susanne Heun, Bad Soden (DE); Heinrich Becker, Eppstein-Niederjosbach (DE); Esther Breuning, Niedernhausen (DE)

(73) Assignee: Covion Organic Semiconductors GmbH, Wiesbaden (DE)

( * ) Notice: Subject to any disclaimer, the term of this patent is extended or adjusted under 35 U.S.C. 154(b) by 857 days.

(21) Appl. No.: 10/544,437

(22) PCT Filed: Feb. 4, 2004

(86) PCT No.: PCT/EP2004/000994

§ 371 (c)(1),
(2), (4) Date: Aug. 23, 2005

(87) PCT Pub. No.: WO2004/070772

PCT Pub. Date: Aug. 19, 2004

(65) Prior Publication Data

US 2006/0149022 A1    Jul. 6, 2006

(30) Foreign Application Priority Data

Feb. 6, 2003    (DE) .................. 103 04 819

(51) Int. Cl.
C08G 73/06 (2006.01)
C08G 59/00 (2006.01)
C08G 59/68 (2006.01)
C08G 61/02 (2006.01)
C08G 65/00 (2006.01)

(52) U.S. Cl. .................. 528/423; 528/102; 528/88; 528/86; 525/540; 428/690; 428/917

(58) Field of Classification Search ................. 528/423, 528/102, 88, 86; 525/540; 428/690, 917
See application file for complete search history.

(56) References Cited

U.S. PATENT DOCUMENTS

| 6,124,046 A | 9/2000 | Jin et al. |
| 2001/0037012 A1 | 11/2001 | Towns et al. |
| 2002/0028347 A1 | 3/2002 | Marrocco et al. |

(Continued)

FOREIGN PATENT DOCUMENTS

JP    64006305 U    1/1984

(Continued)

OTHER PUBLICATIONS

Yamada et al; Organic electroluminescent component; Jan. 2003; Konica Co., Japan; Chem Abstract 138: 97996.*

(Continued)

*Primary Examiner*—Duc Truong
(74) *Attorney, Agent, or Firm*—Connolly Bove Lodge & Hutz LLP

(57) ABSTRACT

The present invention relates to conjugated polymers comprising specific carbazole structural units. The materials according to the invention display steeper current-voltage curves and are therefore better suited to use in organic light-emitting diodes than are comparative polymers which do not contain these units.

37 Claims, 1 Drawing Sheet

U.S. PATENT DOCUMENTS

Figure 1:
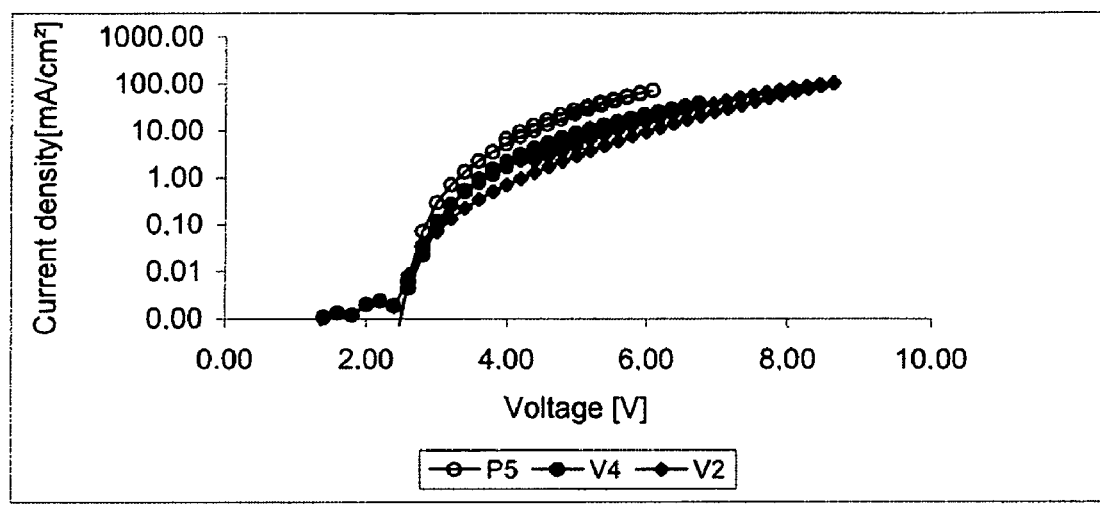

2003/0008175 A1     1/2003   Lee et al.

FOREIGN PATENT DOCUMENTS

| | | |
|---|---|---|
| JP | 11-124573 A | 5/1999 |
| WO | WO-01/66618 A1 | 9/2001 |
| WO | WO-01/96454 | 12/2001 |
| WO | WO-03/074628 | 9/2003 |

OTHER PUBLICATIONS

Zhu, Z. et al., "Synthesis and Characterization of Monodendrons Based on 9-Phenylcarbazole", J. Org. Chem (2000), 65, pp. 116-123.

Meng, H. et al., "Synthesis and Electrochemical Characterization of a New Polymer Constituted of Alternating Carbazole and Oxadiazole Moieties", Synthetic Metals (1999), 100, pp. 297-301.

Wang, S. et al., "Synthesis and Electroluminescent Properties of Heterocycle-Containing Poly(p-phenylene vinylene) Derivatives", Synthetic Metals (1999), 99, pp. 249-252.

Zotti, G. et al., "Electrochemical, Conductive, and Magnetic Properties of 2,7-Carbazole-Based Conjugated Polymers", Macromolecules (2002), 35, pp. 2122-2128.

Sasakawa, T. et al., "Improved Hole Drift Mobility in Excimer-Free Polymers Containing a Dimeric Carbazole Unit", Macromolecules (1989), 22, pp. 4253-4259.

O'Brien, D.F. et al, "Electrophosphoresence from a doped polymer light emitting diode" Synthetic Metals, pp. 379-383, (2001).

Zhu Weiguo et al, "Highly efficient electrophosphorescent devices based on conjugated polymers doped with iridium complexes" Applied Physics Letters, vol. 80 No. 12, pp. 2045-2047, Mar. 25, 2002.

Ohmore, Yutaka et al., "Enahancement of electoluminescecne utilizing confined energy transfer for red light emission", Thin Solid Films 393 (2001), pp. 407-411.

* cited by examiner

CONJUGATED POLYMERS AND BLENDS CONTAINING CARBAZOLE, REPRESENTATION AND USE THEREOF

RELATED APPLICATIONS

This application is a national stage application (under 35 U.S.C. 371) of PCT/EP2004/000994 filed Feb. 4, 2004 which claims benefit to German application 103 04 819.7 filed Feb. 6, 2003.

Wide-ranging research on the commercialization of display and lighting elements based on polymeric (organic) light-emitting diodes (PLEDs) has been pursued for about 12 years. This development was triggered by the fundamental developments disclosed in EP 423 283 (WO 90/13148). Recently, a first product in the form of a relatively small display (in a shaver from PHILIPS N.V.) has also become available on the market. However, significant improvements are still necessary to make these displays genuinely competitive with the liquid crystal displays (LCDs) which currently dominate the market or to surpass them. In particular, it is necessary to provide polymers for all emission colors (red, green, blue) which meet the requirements of the market (color saturation, efficiency, operating life, voltage, to name the most important).

Various classes of materials have been proposed or developed as polymers for full-color display elements. Thus, polyfluorene derivatives as are disclosed, for example, in EP 0842208, WO 99/54385, WO 00/22027, WO 00/22026 and WO 00/46321 come into consideration. Furthermore, polyspirobifluorene derivatives as disclosed in EP 0707020, EP 0894107 and WO 03/020790 are also possibilities. Polymers which comprise a combination of the two first-named structural elements, as disclosed in WO 02/077060, have also been proposed. In general, polymers comprising poly-paraphenylene (PPP) as structural element are possible for such use. Apart from the abovementioned classes, "ladder PPPs" (=LPPPs) (e.g. as described in WO 92/18552), polytetrahydropyrenes (e.g. as described in EP-A-699699) and also PPPs containing ansa structures (e.g. as described in EP-A-690086), for example, also come into question.

As has already been established in some of the abovementioned patent applications, it is necessary to polymerize particular comonomers into the appropriate polymers in order to produce all three emission colors (cf., for example, WO 00/46321, DE 10143353.0 and WO 02/077060). It is then generally possible, starting from a blue-emitting backbone, to produce the two other primary colors red and green.

Furthermore, it has been reported that the insertion of particular arylamino groups gives an improvement in the properties:

WO 99/54385 describes polyfluorenes whose efficiency and operating voltage can be improved by polymerizing derivatives of triphenylamine, tetraphenyl-p-diaminobenzene or tetraphenyl-4,4'-diaminobiphenyl into the main chain of the respective polymers.

DE 19846767 describes polyfluorenes in which the efficiency and operating voltage is likewise improved by incorporating substituted diarylamino units into the main chain.

WO 01/49769 describes polymers containing triarylamino groups in which at least one of the aryl groups is a heteroaryl group in general terms. Particular advantages of these polymers are not described.

WO 01/66618 describes copolymers which have not only aryl units but also specific triarylamino or tetraaryl-p-di-aminoarylene units in the main chain. The corresponding amino building blocks comprise trifluoromethyl-substituted phenyls which are bound directly to the nitrogen atoms, but are not incorporated into the main chain. An advantage mentioned is that these materials have, especially in contrast to the derivatives mentioned in the above-mentioned WO 99/54385, a more readily adjustable HOMO position and therefore have advantages in use.

Despite the progress cited in the abovementioned patent applications, there is still a considerable need for improvements in such materials. Significant improvements are still necessary in, inter alia, the following fields:

(1) The current-voltage curves have to become considerably steeper for a high brightness to be achieved in use at sufficiently low voltages and thus a higher power efficiency to be achieved. This is of tremendous importance since, firstly, it allows the same brightness to be achieved at a lower energy consumption, which is very important for, in particular, mobile applications (displays for mobile telephones, PDAs, etc.). Secondly, higher brightnesses are obtained at the same energy consumption, which can be of interest for, for example, lighting applications.

(2) Many of the BLUE-emitting polymers described do not display a saturated deep blue emission, but instead a light blue emission whose color saturation is not satisfactory for all applications.

As can be seen from this description of the prior art, there continues to be a great need for improvements in the field of light-emitting polymers.

We have surprisingly found that hitherto unknown polymers comprising particular carbazole units give considerable improvements, especially in the two abovementioned areas, i.e. the steepness of the current-voltage curves (and thus the operating voltage) and the color. These are therefore subject matter of the present patent application.

The invention accordingly provides conjugated polymers (POLY1) comprising 1-100 mol %, preferably 5-100 mol %, particularly preferably 10-100 mol %, of units of the formula (I),

FORMULA (I)

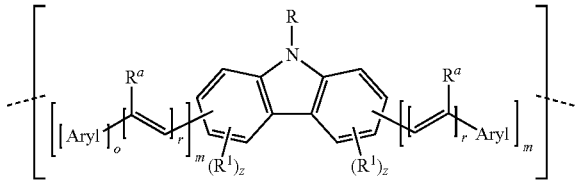

where the symbols and indices have the following meanings:

R is identical or different on each occurrence and is a cycloalkyl system which has from 3 to 40 carbon atoms and may be substituted or unsubstituted, an aromatic or heteroaromatic ring system which has from 2 to 40 carbon atoms and may be substituted or unsubstituted or an alkylenearyl, alkylenecycloalkyl or alkyleneheteroaryl system which has a linear or branched alkylene chain having from 1 to 16 carbon atoms and may be substituted or unsubstituted; the aryl, heteroaryl and cycloalkyl systems can also be part of a larger fused aromatic or aliphatic ring system;

the possible substituents $R^1$ can potentially be located on each free position;

Aryl are identical or different on each occurrence and are each an aromatic or heteroaromatic ring system which has from 2 to 40 carbon atoms and may be substituted or unsubstituted or a substituted or unsubstituted stilbenylene or tolanylene unit; the possible substituents $R^1$ can potentially be located on each free position;

$R^1$ is identical or different on each occurrence and is a straight-chain, branched or cyclic alkyl or alkoxy chain which has from 1 to 22 carbon atoms and in which one or more nonadjacent carbon atoms may also be replaced by N—$R^2$, O, S, —CO—O—, O—CO—O, where one or more H atoms may also be replaced by fluorine, an aryl or aryloxy group which has from 5 to 40 carbon atoms and in which one or more carbon atoms may also be replaced by O, S or N which may also be substituted by one or more nonaromatic radicals $R^1$, or Cl, F, CN, $N(R^2)_2$, $B(R^2)_2$, where two or more radicals $R^1$ may also together form a ring system;

$R^a$ is identical or different on each occurrence and is a straight-chain, branched or cyclic alkyl or alkoxy chain which has from 1 to 22 carbon atoms and in which one or more nonadjacent carbon atoms may also be replaced by N—$R^2$, O, S, —CO—O—, O—CO—O, where one or more H atoms may also be replaced by fluorine, an aryl or aryloxy group which has from 5 to 40 carbon atoms and in which one or more carbon atoms may also be replaced by O, S or N which may also be substituted by one or more nonaromatic radicals $R^1$, or Cl, F, CN, $N(R^2)_2$, $B(R^2)_2$;

$R^2$ is identical or different on each occurrence and is H, a straight-chain, branched or cyclic alkyl chain which has from 1 to 22 carbon atoms and in which one or more non-adjacent carbon atoms may also be replaced by O, S, —CO—O—, O—CO—O, where one or more H atoms may also be replaced by fluorine, an aryl group which has from 5 to 40 carbon atoms and in which one or more carbon atoms may also be replaced by O, S or N which may also be substituted by one or more nonaromatic radicals $R^1$;

m is identical or different on each occurrence and is 0, 1 or 2;

o is identical or different on each occurrence and is 0, 1 or 2, with the proviso that o must not be 0 when m=2;

r is identical or different on each occurrence and is 0 or 1, z is identical or different on each occurrence and is 0, 1, 2 or 3;

the open-line bond indicates the linkage in the polymer; it should in the present case not be a methyl group.

The carbazole unit can be bound in various ways in the polymer chain: linkage at only one of the points leads to an end group or to incorporation of the structural unit of the formula (I) into the side chain; linkage at two positions leads to incorporation of the monomer into the main chain of the polymer; incorporation of the structural unit of the formula (I) into the main chain preferably occurs via the 3,6 or 2,7 positions of the carbazole or else via the 2,9 or 3,9 positions if R is an aromatic or heteroaromatic ring system in the last two cases so that conjugation of the polymer is retained. The carbazole is particularly preferably incorporated via the 3,6 or 2,7 positions or via the 3,9 positions if R is an aromatic or heteroaromatic ring system. It is very particularly preferably incorporated via the 3,6 or 2,7 positions. For the sake of clarity, the numbering of carbazole is indicated in the following structure:

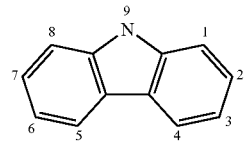

For the purposes of the present invention, conjugated polymers are polymers which contain mainly $sp^2$-hybridized (or also sp-hybridized) carbon atoms in the main chain, which may also be replaced by appropriate heteroatoms. In the simplest case, this means the presence of alternating double and single bonds in the main chain. "Mainly" means that naturally occurring defects which lead to interruptions to the conjugation do not invalidate the term "conjugated polymers". Furthermore, a polymer in which, for example, arylamine units such as the carbazole of the formula (I) or other such units and/or particular heterocycles (i.e. conjugation via N, O or S atoms) and/or organometallic complexes (i.e. conjugation via the metal atom) are present in the main chain is likewise described as conjugated in the present patent application. On the other hand, units such as simple (thio)ether bridges, ester linkages, amide or imide linkages would be unambiguously defined as non-conjugated segments.

The polymers of the invention can comprise further structural elements in addition to the units of the formula (I). These are, inter alia, those which have been disclosed in the above-mentioned patent applications. Reference will at this point be made, in particular, to the relatively comprehensive listing in the abovementioned patent application WO 02/077060; this is incorporated by reference into the present invention. The further structural units can come, for example, from the classes described below:

1. Structural units which can form the polymer backbone or BLUE-emitting units:
   Mention should here firstly be made of units which form polyphenylenes and structures derived therefrom. These are, for example, (in each case substituted or unsubstituted) ortho-, meta- or para-phenylenes, 1,4-naphthylenes, 9,10-anthracenylenes, 2,7-phenanthrenylenes, 1,6- or 2,7- or 4,9-pyrenylenes or 2,7-tetrahydropyrenylenes. Corresponding heterocyclic "polyphenylene"-forming structures, for example 2,5-thiophenylene, 2,5-pyrrolylene, 2,5-furanylene, 2,5-pyridylene, 2,5-pyrimidinylene or 5,8-quinolinylene are also possible.
   Furthermore, more complex units such as the above-mentioned fluorenes, spiro-9,9'-bifluorenes, multiply bridged units (e.g. short segments of the abovementioned LPPP polymers) and also "double fluorene" units (indenofluorenes) are possible. These, too, may be substituted or unsubstituted. Corresponding heterocyclic structures in which, for example, individual ring carbons are replaced by heteroatoms such as sulfur are also possible here.

2. Structural units which improve the charge injection properties or charge transport properties. This can relate both to the electron injection or electron transport properties (for example oxadiazole units) and to the hole injection or hole transport properties (for example triarylamine units). Here, reference may once again be made to the comprehensive listing of such structural units in the above-cited patent application WO 02/077060; this is incorporated by reference into the present invention. Naphthylarylamines as are described in the unpublished patent application DE 10249723.0 are likewise possible for this purpose.

3. Structural units which, for example, shift the color of the emission, thus also alter the band gap of the polymer and thus generally also alter the charge injection or charge transport properties:

Mention may here be made of, for example, further heterocyclic compounds such as the structures mentioned in the abovementioned patent application WO 02/077060 under the formulae (XX) to (XXXXV).

Furthermore, arylene-vinylene or arylene-acetylene structures such as substituted or unsubstituted stilbenylenes, tolanylenes, bisstyrylarylenes, bis(arylacetylene) arylenes may also be mentioned here.

Finally, the incorporation of relatively large aromatic units such as chrysenes, naphthacenes, pentacenes, perylenes or coronenes can also produce the color-shifting effect.

4. Structural units which can emit light with high efficiency from the triplet state even at room temperature:

These are firstly, in particular, compounds containing heavy atoms, i.e. atoms from the Periodic Table of the Elements which have an atomic number of greater than 36.

Compounds which contain d and f transition metals which meet the abovementioned conditions are particularly suitable for this purpose. Very particular preference is given here to corresponding structural units containing elements of groups 8 to 10 (i.e. Ru, Os, Rh, Ir, Pd, Pt).

Various complexes which are described, for example, in the patent applications WO 02/068435, WO 02/081488, EP 1239526 and the unpublished patent application DE 10238903.9 are possible as structural units for the polymers of the invention.

A selection of preferred further units for the polymers of the invention are listed in the following overview:

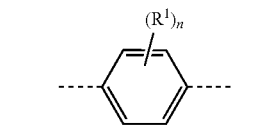
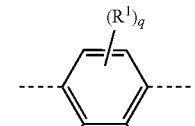
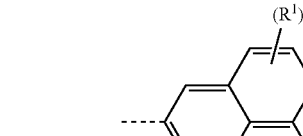
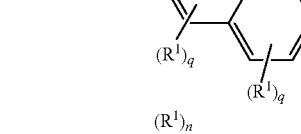
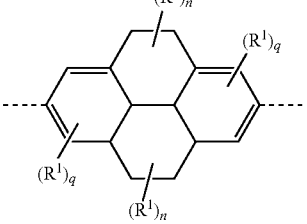
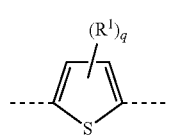

-continued

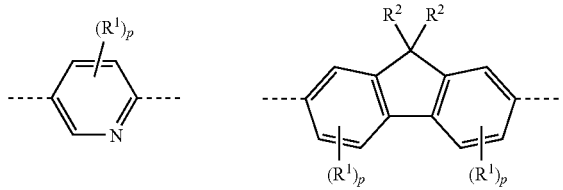
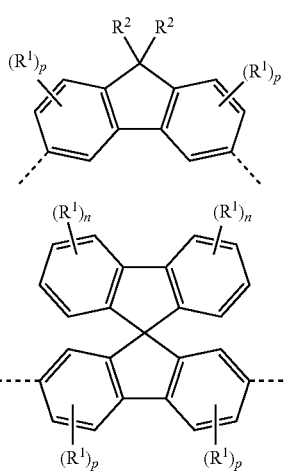
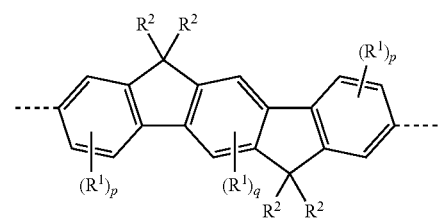
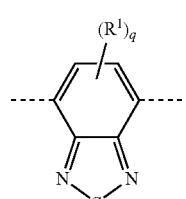
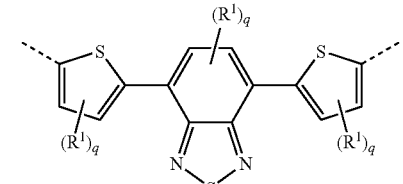
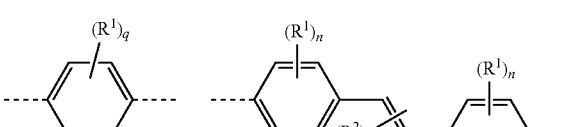
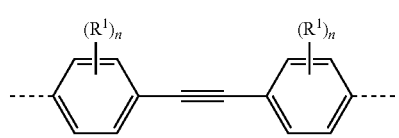

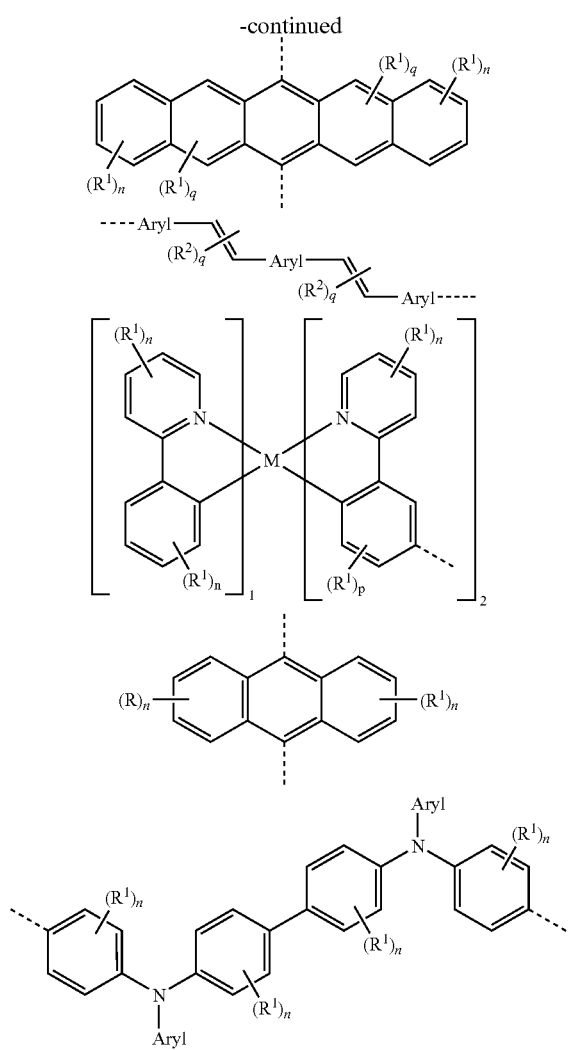

The symbols Aryl, $R^1$ and $R^2$ used here are defined analogously to those described further above.

n is identical or different on each occurrence and is 0, 1, 2, 3 or 4;

p is identical or different on each occurrence and is 0, 1, 2 or 3;

q is identical or different on each occurrence and is 0, 1 or 2;

M is identical or different on each occurrence and is Rh or Ir;

and the broken-line bonds shown in each case symbolize the linkage in the polymer; these should in the present case not be methyl groups.

The polymers of the invention are either homopolymers, i.e. they contain only one structure of the formula (I), or copolymers. It can be preferred that these either contain a plurality of different structural units of the formula (I) or contain one or more of the above-described or above-listed structural units in addition to one or more structural unit(s) of the formula (I).

The copolymers of the invention can have either random or alternating or block-like structures or a plurality of these structures can alternate in them. The use of a plurality of different structural elements enables properties such as solubility, solid state morphology, color, etc., to be adjusted.

As stated above, particularly preferred polymers according to the invention comprise at least 10 mol % of structural units of the formula (I). Specifically for use as emitting material in the PLEDs mentioned, a proportion in this order of magnitude has been found to be useful. For other applications, e.g. as charge transport layer in organic field effect transistors (OFETs), a significantly higher proportion (up to 100 mol %) can also prove to be useful.

In preferred structures of the formula (I), the following applies:

R is identical or different on each occurrence and is an aromatic or heteroaromatic ring system selected from among thiophene, benzothiophene, benzene, pyridine, quinoxaline, fluorene, spirobifluorene, naphthalene, anthracene, pyrene and phenanthrene which bears from 0 to 3 substituents $R^1$ on the free positions or an alkylenearyl or alkyleneheteroaryl ring system whose alkylene chain can be linear or branched and has from 1 to 16 carbon atoms and whose aryl and heteroaryl system consists of the systems described in detail above which bear from 0 to 3 substituents $R^1$ on the free positions;

Aryl is identical or different on each occurrence and is an aromatic or heteroaromatic ring system which has from 2 to 40 carbon atoms and may be substituted or unsubstituted; the aryl and heteroaryl systems can also be part of a larger fused aromatic ring system; the possible substituents $R^1$ can, if present, be located on each free position;

$R^1$, $R^2$, $R^a$, r, z are analogous to the definitions given above;

m is identical or different on each occurrence and is 0 or 1;

o is identical or different on each occurrence and is 0, 1 or 2;

the structural unit of the formula (I) is bound into the main chain of the polymer via the 3,6 or 2,7 positions or via the 2,9 or 3,9 positions if R is an aromatic or heteroaromatic unit.

In particularly preferred structures of the formula (I), the following applies:

R is identical or different on each occurrence and is an aromatic or heteroaromatic ring system selected from among thiophene, benzothiophene, benzene, pyridine, naphthalene, anthracene, pyrene and phenanthrene which are unsubstituted or substituted by a substituent $R^1$, or a 9,9'-substituted fluorene or a methylenearyl or methyleneheteroaryl ring system whose aryl or heteroaryl system comprises the systems described in detail above which can have the same substitution pattern as the abovementioned systems;

Aryl is identical or different on each occurrence and is an aromatic or heteroaromatic ring system which has from 2 to 20 carbon atoms and may be substituted or unsubstituted; the aryl and heteroaryl systems can also be part of a larger fused aromatic ring system; the possible substituents $R^1$ can potentially be located on each free position;

$R^1$, $R^2$, $R^a$, r are analogous to the definitions given above;

m is identical or different on each occurrence and is 0 or 1;

o is identical or different on each occurrence and is 0, 1 or 2;

z is identical or different on each occurrence and is 0 or 1;

the structural unit of the formula (I) is bound into the main chain of the polymer via the 3,6 positions, the 2,7 positions or the 3,9 positions if R is an aryl or heteroaryl system.

Particularly preferred structures of the formula (I) are substituted or unsubstituted structures corresponding to the depicted formulae (II) to (XXXI), where the broken-line bonds define the linkage in the polymer and potential substituents are generally not shown in the interests of clarity:

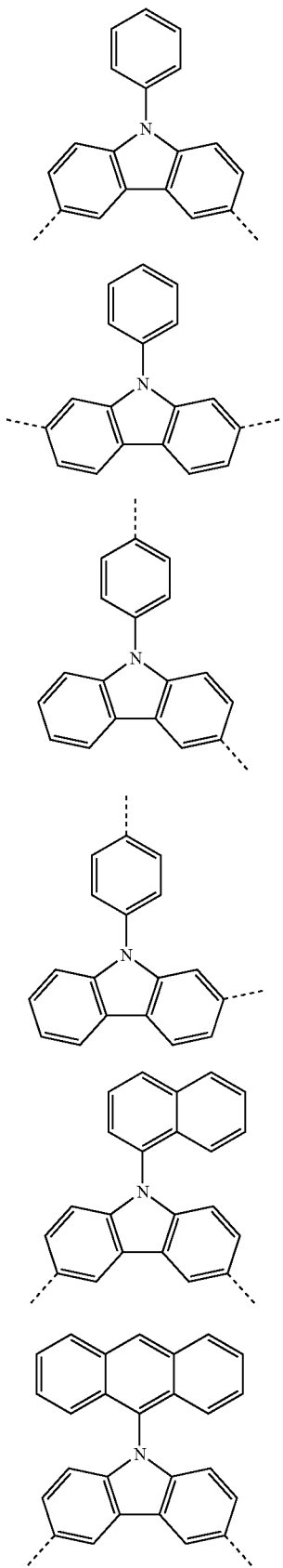
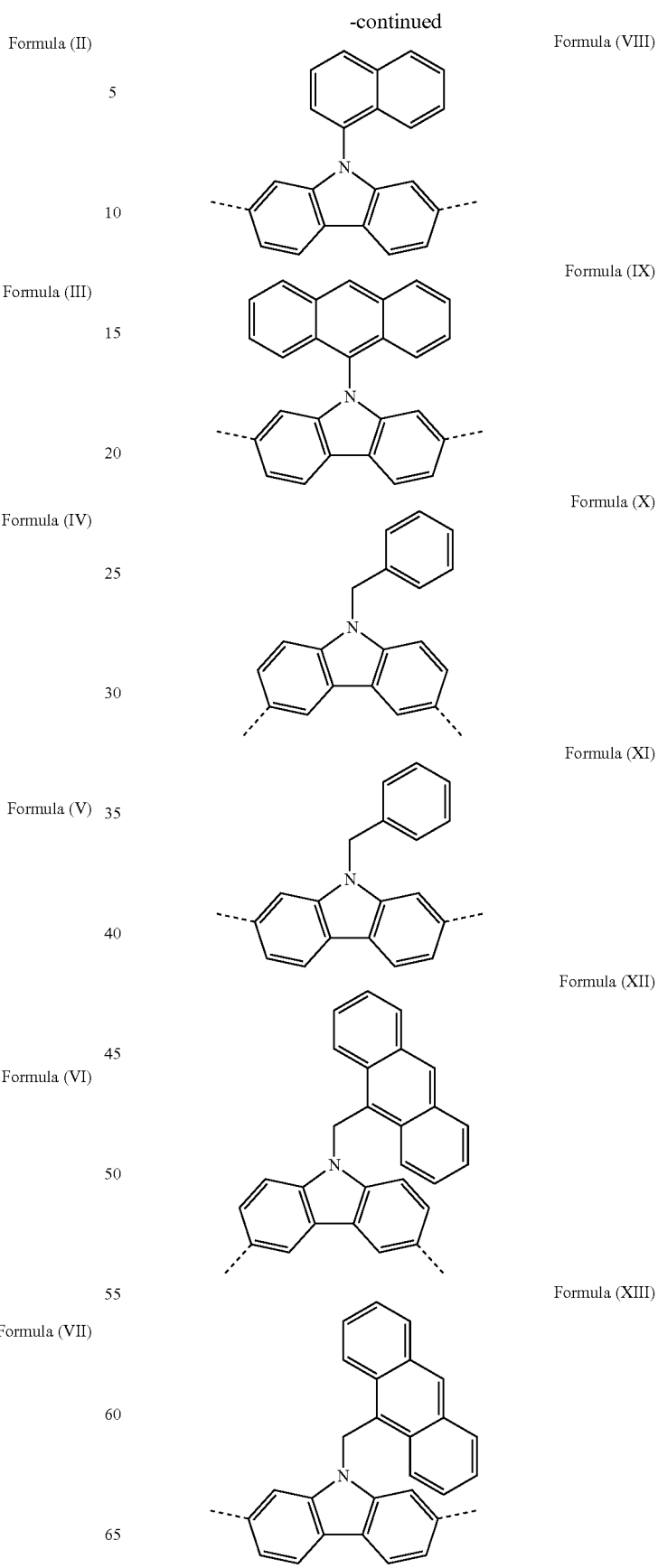

-continued
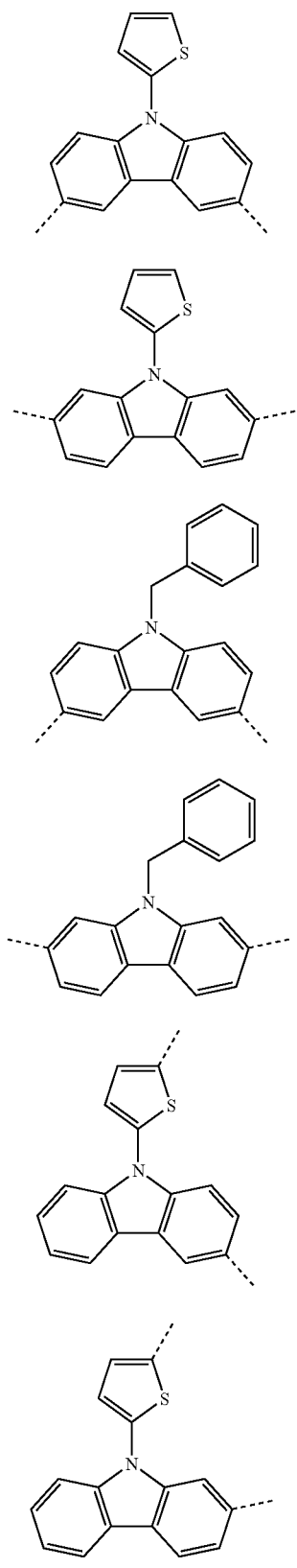
Formula (XIV)
Formula (XV)
Formula (XVI)
Formula (XVII)
Formula (XVIII)
Formula (XIX)
-continued
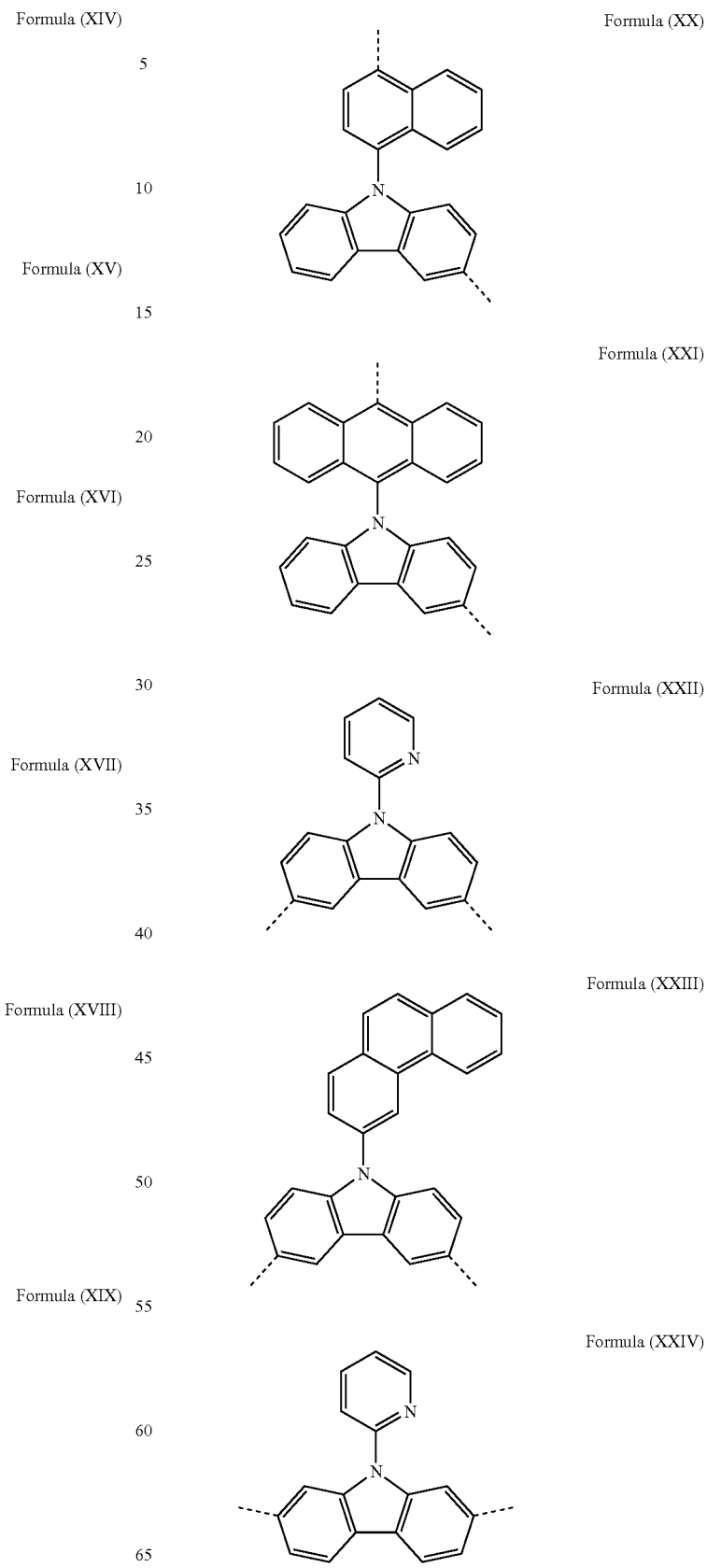
Formula (XX)
Formula (XXI)
Formula (XXII)
Formula (XXIII)
Formula (XXIV)

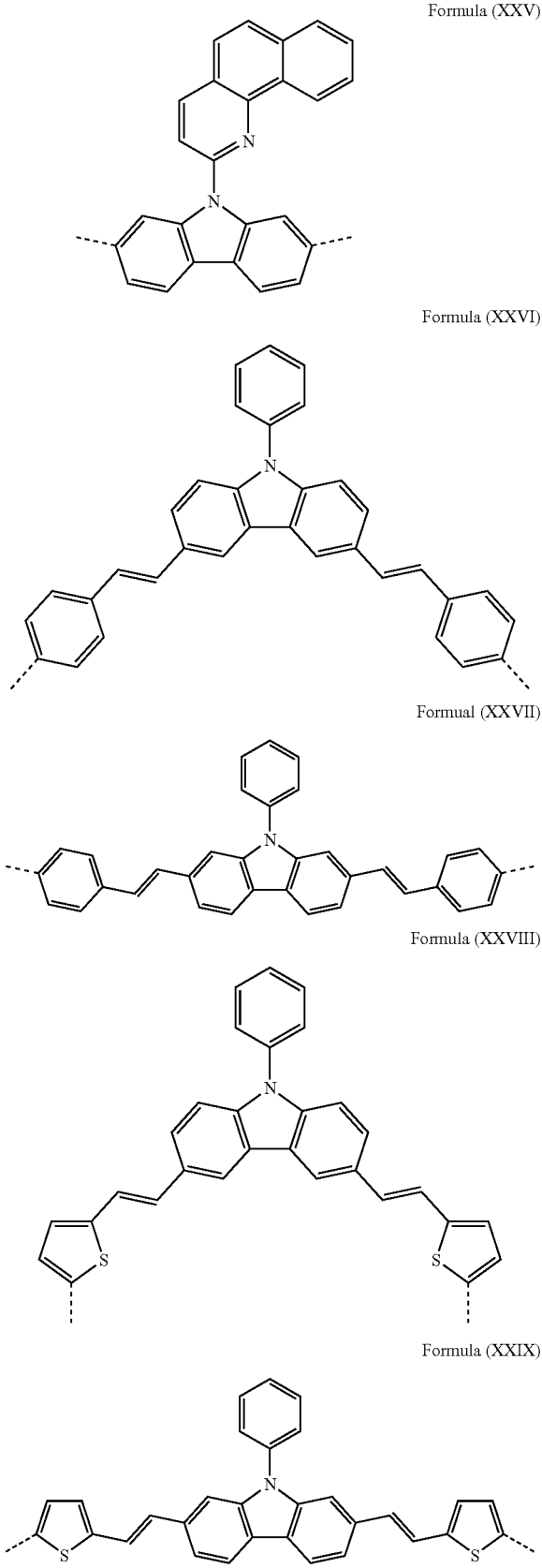

Formula (XXV)

Formula (XXVI)

Formual (XXVII)

Formula (XXVIII)

Formula (XXIX)

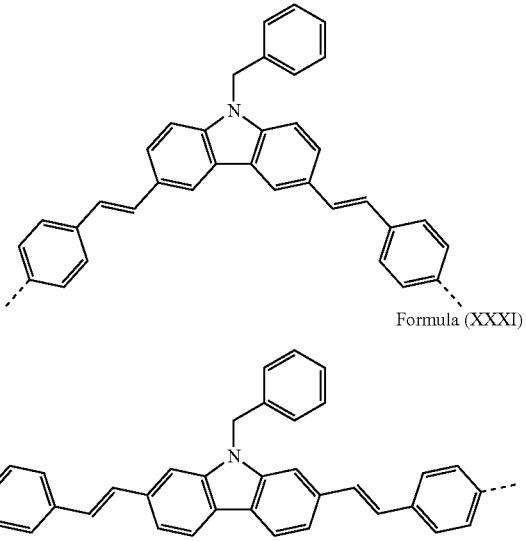

Formula (XXX)

Formula (XXXI)

In very particularly preferred structures of the formula (I), the following applies:

R is identical or different on each occurrence and is an aromatic or heteroaromatic ring system selected from among thiophene, benzothiophene, benzene, naphthalene, anthracene and phenanthrene which are unsubstituted or substituted by a substituent $R^1$, or a benzyl group whose phenyl group can have the same substitution pattern as the abovementioned systems;

Aryl is identical or different on each occurrence and is an aromatic or heteroaromatic ring system which has from 2 to 20 carbon atoms and may be substituted or unsubstituted; the aryl and heteroaryl systems can also be part of a larger fused aromatic ring system; the possible substituents $R^1$ can potentially be located on each free position;

$R^1$, $R^2$, $R^a$, r are analogous to the definitions given above;

m is identical or different on each occurrence and is 0 or 1;

o is 1 on each occurrence;

where the unit is bound into the polymer chain via the 3,6 or 2,7 positions of the carbazole.

Even if this is indicated by the description, it will at this point be once more stated explicitly that both the structural units of the formula (I) and any units of the formulae (II) to (XXXI) can be unsymmetrically substituted, i.e. different substituents $R^1$ can be present on one unit or these can also be bound in different positions.

The polymers of the invention generally have from 10 to 10 000, preferably from 50 to 5000, particularly preferably from 50 to 2000, repeating units. The polydispersity PD is preferably less than 10, particularly preferably less than 5.

The necessary solubility is achieved, in particular, by means of the substituents $R^1$ both on structures of the formula (I) and on structures which, as indicated above, are additionally present in corresponding copolymers.

In general, it is therefore necessary for at least 2 non-aromatic carbon atoms to be present on average in the substituents per repeating unit. Preference is given to at least 4, particularly preferably at least 8, carbon atoms. Individual carbon atoms among these carbon atoms can also be replaced by O or S. This does not rule out a situation where a particular proportion of repeating units, both of the formula (I) and of other structural types, bear no further nonaromatic substituents.

Preference is given to no long-chain substituents having more than 12 carbon atoms, preferably none having more than 8 carbon atoms, particularly preferably none having more than 6 carbon atoms in a linear chain, being present, so that the morphology of the film is not impaired.

Nonaromatic carbon atoms are, as in the description of $R^1$, present in appropriate straight-chain, branched or cyclic alkyl or alkoxy chains.

Preference is therefore also given to polymers according to the invention in which:
$R^1$ is identical or different on each occurrence and is a straight-chain, branched or cyclic alkyl or alkoxy chain having from 1 to 10 carbon atoms, where one or more H atoms may also be replaced by fluorine, or an aryl group which has from 6 to 14 carbon atoms and is also substituted by one or more nonaromatic radicals $R^1$.

Particular preference is therefore also given to polymers according to the invention in which:
$R^1$ is identical or different on each occurrence and is a straight-chain or branched alkyl or alkoxy chain having from 1 to 8 carbon, atoms or an aryl group which has from 6 to 10 carbon atoms and is also substituted by one or more nonaromatic radicals $R^1$.

The polymers of the invention have, inter alia, the following surprising advantages compared to the abovementioned prior art:

The current at a given voltage is significantly higher for comparable polymers when used in PLEDs (cf. data in table 2 and in FIG. 1), i.e. the current-voltage curve is steeper when the polymer comprises structural units of the formula (I). This gives significant advantages, as indicated above, in use since the objective of producing efficient full-color displays having a low energy consumption is made possible.

The use of polymers according to the invention for the production of blue emission surprisingly has further advantages: the emission color becomes deeper (i.e. deep blue) than that obtained when using analogous polymers without structural units of the formula (I) (compare, for example, polymers P1 and P2 with polymers C1 and C2).

Copolymers of this type can be constructed so that they can emit all primary colors (red, green, blue).

The solubility in organic solvents is generally good, i.e. the polymers are soluble in concentrations of from 1 to at least 30 g/l (depending on molecular weight) in solvents such as toluene, xylene, anisole, methylanisole or methyl-naphthalene.

The polymers of the invention are generally prepared by polymerization of one or more monomers of which at least one comprises structures of the formula (I).

There is in principle a relatively large number of different polymerization reactions suitable for this purpose; however, the types listed below, which all lead to C-C bond formation, have been found to be particularly useful:
(A) SUZUKI polymerization
(B) YAMAMOTO polymerizations
(C) STILLE polymerizations
(D) HARTWIG/BUCHWALD polymerizations
More precise details regarding the polymerization methods (A) to (D) may be found, for example, in the unpublished patent application DE 10249723.0. In the case of polymers containing double bonds (alkene units), the following polymerization methods are also possible:

(E) WITTIG-HORNER polymerization: here, monomers used are firstly a bisaldehyde and secondly bisphosphonates or corresponding monoaldehyde monophosphonates and these are reacted under basic conditions in the presence of solvents to give the corresponding alkene compounds. Reactions of this type which lead to conjugated polymers have been described hitherto:
(i) A. P. Davey et al., *Synth. Met.* 1999, 103, 2478,
(ii) S.-H. Jin et al., *Eur. Polym. J.* 2002, 38, 895. The corresponding descriptions are hereby incorporated by reference into the present patent application.
(F) Polymerization by precursor methods (for example sulfoxy precursor methods): starting from bis(chloromethyl) compounds which are able to form a quinodimethane, alkylthiomethyl-chloromethyl intermediates are firstly obtained by substitution on one side. The sulfoxide is obtained from these intermediates by oxidation. This precursor monomer is reacted under the conditions of the Gilch polymerization, with the effective monomer being an alkylsulfoxyquinodimethane. The relatively temperature-stable precursor polymer obtained in this way is a poly(arylene-alkylsulfoxyethylene) which when simply heated at below 200° C. eliminates alkylsulfinic acid to form the fully conjugated polymer. These reactions are described, inter alia, in the following references: (i) WO 00/35987 (ii) A. Issaris, D. Vanderzande, *Macromolecules* 1998, 31, 4426-4431. The corresponding descriptions are hereby incorporated by reference into the present patent application.

The ways in which the polymerizations can preferably be carried out and the ways in which the polymers can then be separated off from the reaction solution and be purified are described, for example, in the unpublished patent application DE 10249723.0.

To be able to prepare the polymers of the invention, for example by the abovementioned methods, the corresponding monomers are required, as described.

In the case of structures of the formula (I), these can be obtained, for example, as described in the following:

The synthesis of 3,6-dibromocarbazole is carried out by bromination of carbazole, as described in the literature: Smith et al., *Tetrahedron* 1992, 48, 7479-7488.

The synthesis of 2,7-dibromocarbazole is carried out by building up the carbazole, as described in the literature: Tidwell et al., *Eur. J. Med. Chem.* 1997, 32, 781-793.

An appropriate functionalization which makes use as monomers possible (i.e., for example, introduction of halogen end groups) can either be carried out on the precursors or as last step on the previously fully constructed monomeric skeleton. Both variants have both advantages and disadvantages, depending on the desired target structure.

The functions can be present beforehand if they do not react or react only sluggishly in the reaction to form the appropriate monomer. This can, for example, be the case for a simple substitution reaction or when different reactivities (e.g. iodine versus bromine, or bromine versus chlorine) can be exploited. Thus, for example, a monomer which gives the structural units of the formula (III) can be prepared by exploiting the selectivity of iodine compared to bromine, as described in example 2.

On the other hand, it can also be advantageous (e.g. in the case of existing substitution or directing radicals) firstly to build up the N-substituted carbazole skeleton and to introduce the halide in a last step. It is thus possible, for example, to introduce bromine in the 3 and 6 positions of the carbazole in structures of the formula (II) (for example by means of a mild NBS bromination, cf., for example, Creason et al., *J. Org. Chem.*, 1972, 37, 4440), when a substituent is present in the para position on the N-aryl substituent. As indicated above, this process can generally be employed in the presence of (i) appropriate blocking substituents, (ii) appropriate directing radicals or (iii) activated or deactivated heterocycles even for further structures of the formula (I).

The N-alkylation or N-benzylation of carbazoles is known in the literature. Likewise, N-alkylarylcarbazoles and N-cycloalkylcarbazoles can be obtained. The synthesis is carried out by reaction of carbazole with an alkylating agent under basic conditions, as described, for example, in: M. E. Wright, M.-J. Jin, *J. Org. Chem.* 1989, 54, 965-968.

The N-arylation of carbazole can be carried out by the Hartwig-Buchwald method and is described for carbazole in, for example: M. Watanabe et al., *Tetrahedron Lett.* 2000, 41, 481-483.

Starting from the halide derivatives produced in this way, corresponding bisboronic acid derivatives or bisstannane derivatives (which are required for the abovementioned polymerization processes of the types A and C) can be prepared by standard methods. These methods are well known to those skilled in the art and generally comprise replacing the halogen present by a metal (e.g. magnesium, lithium) and then reacting the product with a boric ester compound or a trialkyltin halide compound. For the preparation of boronic acid derivatives, catalytic processes involving direct reaction of the halides with, for example, diboranes in the presence of palladium are also known. Comparable reactions are also known for the corresponding tin compounds. Corresponding monohalide-monoboronic acid derivatives or monohalide-monostannane compounds are also obtainable if a suitable stoichiometry is employed.

The corresponding bisaldehyde derivatives required for the abovementioned polymerization process of the type E can likewise be prepared from the halide derivatives. This method is well known to those skilled in the art and generally comprises replacing the halogen present by a metal (e.g. magnesium, lithium) and then reacting the product with a formic acid derivative (e.g. dimethylformamide).

The corresponding phosphonate derivatives which are required for the abovementioned polymerization process of the type E can be produced from the corresponding methylene halide compounds which are then reacted with trialkyl esters of phosphorous acid. Such processes are well known to those skilled in the art.

The synthesis of the further monomers which lead to structures which do not correspond to the formula (I) but have been described above is comprehensively described in the abovementioned patent applications and patents.

A good overview is given by the patent application WO 02/077060; the details given there on this subject are incorporated by reference into the present patent application.

The polymers obtained in this way can be used as single components in applications described in more detail below. They can also be used as blends (mixtures of polymers with further polymeric or low molecular weight components). The invention thus also provides a blend of the polymer of the invention with other polymers which can be, for example, conjugated or non-conjugated.

Furthermore, it is known and prior art that blends (mixtures) of nonconjugated polymers such as PVK (polyvinylcarbazole) with low molecular weight metal complexes which allow transfer of singlet excitons to triplet excitons and can emit light from the triplet state result in efficient electroluminescence of the metal complex. Such mixtures are described, for example, by F.-C. Chen et al., (*Appl. Phys. Lett.* 2002, 80, 2308-2310). Compared to metal complexes which have to be vapor deposited in a complicated and expensive process to allow them to be used, these blends offer the advantage that they can be processed more simply and cheaply from solution. However, the operating voltages for these systems are very high, which results in a very low power efficiency.

Blends of low molecular weight metal complexes which emit light from the triplet state with conjugated polymers have likewise been described in the literature. T. F. Guo et al. (*Organic Electronics* 2000, 1, 15) and D. F. O'Brien et al. (*Synth. Met.* 2001, 116, 379) describe good quantum efficiencies when using blends of a platinum-porphyrin complex with polyfluorenes; in both cases, the efficiencies are significantly lower than in the case of comparable devices made up of small molecules. W. Zhu et al. (*Appl. Phys. Lett.* 2002, 80, 2045-2047) describe a blend of a soluble iridium-phenylpyridine complex with a poly-para-phenylene. Better but still relatively low quantum efficiencies were measured in this case. In particular, very high voltages were required for this system, and these would stand in the way of an industrial application. Thus, there continues to be a great need for improvement here, too.

It has surprisingly been found that hitherto unknown blends (i.e. mixtures) of the polymers described below with dendrimers and/or low molecular weight compounds and possibly but not necessarily a further conjugated or nonconjugated polymer give unexpected advantages in the application here. Like the polymers POLY1 of the invention themselves, these novel blends display steeper current-voltage curves and thus lower operating voltages.

The invention thus further provides blends (mixtures) comprising
(A) 5-99.5% by weight of. at least one conjugated polymer (POLY2) comprising 1-100 mol %, preferably 5-100 mol %, particularly preferably 10-100 mol %, of units of the formula (XXXII),

FORMULA (XXXII)

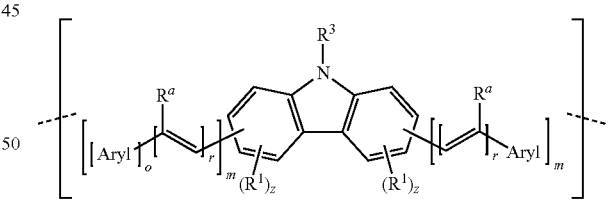

where the symbols and indices have the following meanings:
$R^3$ is identical or different on each occurrence and is a linear or branched alkyl chain which has from 1 to 40 carbon atoms and may be substituted or unsubstituted, a cycloalkyl system which has from 3 to 40 carbon atoms and may be substituted or unsubstituted, an aromatic or heteroaromatic ring system which has from 2 to 40 carbon atoms and may in each case be substituted or unsubstituted or an alkylenearyl, alkylenecycloalkyl or alkyleneheteroaryl system which may be substituted or unsubstituted; the possible substituents $R^1$ can potentially be located on each free position; the aryl and heteroaryl systems can also be part of a larger fused aromatic ring system;

the further symbols and indices are as defined above under the formula (I); and (B) 0.5-95% by weight of at least one organic or organometallic dendrimer or at least one low molecular weight molecule having a molecular weight in the range <10 000 (COMP1) which in a pure or dilute film is capable of fluorescence or phosphorescence and which has adequate solubility in suitable solvents, preferably toluene, xylene, anisole, THF, methylanisole or methylnaphthalene, to be able to be processed in the blend together with the polymer from a solution in this solvent.

The proportion of the dendrimer or the low molecular weight compound in the blend is preferably from 0.5 to 80% by weight, particularly preferably from 1 to 50% by weight, in particular from 2 to 25% by weight.

The proportion of the polymer (POLY2) in the blend is preferably from 20 to 99.5% by weight, particularly preferably from 50 to 99% by weight, in particular from 75 to 98% by weight.

For the present purposes, a dendrimer is a highly branched compound which is made up of a multifunctional core to which branched monomers are bound in a regular arrangement so as to give a tree-like structure. Both the core and the monomers can have any branched structures which may consist of purely organic units and of organometallic compounds or coordination compounds. For the present purposes, a dendrimer is in general terms as described in, for example, M. Fischer, F. Vögtle, *Angew. Chem., Int. Ed.* 1999, 38, 885-905.

The structural unit of the formula (XXXII) is a constituent of homopolymers and copolymers as described above for the structural unit of the formula (I). Here too, the same monomers like, for example, the monomers M1 to M23 indicated in the examples are possible. The synthesis of these polymers can be carried out by the above-described methods. It has been found that in the case of blends which emit light from the singlet state, a proportion in the region of 10 mol % of structural units of the formula (XXXII) in the polymer POLY2 gives good results. For other applications, in particular for blends which emit light from the triplet state, it can be preferable to have a proportion of greater than 10 mol % of structural units of the formula (XXXII) in the polymer POLY2.

Blends which emit light from the triplet state preferably have a proportion of 20-100 mol % of structural units of the formula (XXXII) in the polymer POLY2. A proportion of 30-100 mol % of structural units of the formula (XXXII) is particularly preferred for these blends.

In preferred polymers POLY2, the following applies:
$R^3$ is identical or different on each occurrence and is a linear or branched alkyl chain which has from 1 to 40 carbon atoms and may be substituted or unsubstituted, an aromatic or heteroaromatic ring system selected from among thiophene, benzothiophene, benzene, pyridine, quinoxaline, fluorene, spirobifluorene, naphthalene, anthracene, pyrene and phenanthrene which bears from 0 to 3 substituents $R^1$ on the free positions or an alkylenearyl or alkyleneheteroaryl ring system whose alkylene chain may be linear or branched and has from 1 to 16 carbon atoms and whose aryl or heteroaryl system comprises the systems described in detail above which bear from 0 to 3 substituents $R^1$ on the free positions;

and the further symbols and indices are as described above for preferred structures of the formula (I).

In particularly preferred polymers POLY2, the following applies:
$R^3$ is identical or different on each occurrence and is a linear or branched alkyl chain which has from 2 to 30 carbon atoms and may be substituted or unsubstituted, an aromatic or heteroaromatic ring system selected from among thiophene, benzothiophene, benzene, pyridine, naphthalene, anthracene, pyrene and phenanthrene which are unsubstituted or substituted by a substituent $R^1$, or a 9,9'-substituted fluorene or a methylenearyl or methylene-heteroaryl ring system whose aryl or heteroaryl system comprises the systems described in detail above which can have the same substitution pattern as the systems mentioned above;

and the further symbols and indices are as described above for particularly preferred structures of the formula (I).

In very particularly preferred polymers POLY2, the following applies:
$R^3$ is identical or different on each occurrence and is a linear or branched alkyl chain which has from 3 to 20 carbon atoms and may be substituted or unsubstituted, an aromatic or heteroaromatic ring system selected from among thiophene, benzothiophene, benzene, naphthalene, anthracene and phenanthrene which are unsubstituted or substituted by a substituent $R^1$, or a benzyl ring system whose phenyl group can have the same substitution pattern as the systems mentioned above;

and the further symbols and indices are as defined above for very particularly preferred structures of the formula (I).

The dendrimers or low molecular weight compounds COMP1 used in the blend can be selected from a wide variety of classes of substances. Preference is given here to blends of polymers POLY2 with one or more dendrimers or one or more low molecular weight compounds which make a transfer of singlet excitons to triplet excitons possible and which can emit light with high efficiency from the triplet state even at room temperature: these are firstly, in particular, compounds which contain heavy atoms, i.e. atoms from the Periodic Table of the Elements having an atomic number of greater than 36. Compounds containing d and f transition metals which meet the above-mentioned condition are particularly useful for this purpose. Very particular preference is given here to structural units of this type containing elements of groups 8 to 10 (i.e. Ru, Os, Rh, Ir, Pd, Pt). Possible low molecular weight structural units of this type are, for example, various complexes which are described, for example, in the patent applications WO 02/068435, WO 02/081488, EP 1239526 and the unpublished patent application DE 10238903.9. Dendrimer structures which can be used for this purpose are complexes as described, for example, in the patent applications WO 99/21935, WO 01/059030 and WO 02/066552. The corresponding descriptions are hereby incorporated by reference into the present patent application.

The blends of the invention have, inter alia, the following surprising advantages compared to the abovementioned prior art:
  The current at a given voltage is significantly higher for comparable blends when used in PLEDs (cf. data in table 3), i.e. the current-voltage curve is steeper when the polymer component of the blend comprises structural units of the formula (XXXII). This gives significant advantages, as indicated above, in use since the objective of producing efficient full-color displays having a low energy consumption is made possible.
  The use of blends according to the invention comprising components which emit from the triplet state surprisingly has the following further advantage: the energy transfer from the polymer to the metal complex occurs more efficiently in a blend according to the invention than in comparable blends which do not contain any polymers POLY2, which leads to more efficient emission by the metal complex (cf. data in table 3).

The solubility in organic solvents is generally good, i.e. the polymers POLY1 and blends are soluble in concentrations of from 1 to at least 30 g/l (depending on molecular weight) in solvents such as toluene, xylene, anisole, methylanisole or methylnaphthalene. Possible solvents and solvent mixtures are, for example, those described or cited in the patent application WO 02/072714. Although this is not in itself an improvement over the prior art, it is important that this property is maintained in the introduction of new structures.

The polymers of the invention or the blends of the invention can be used in PLEDS. The way in which PLEDs can be produced is described, comprehensively as a general method in DE 10249723.0, which can be adapted appropriately for each individual case.

As stated above, the polymers of the invention are very particularly useful as electroluminescence materials in PLEDs or displays produced in this way.

As stated above, the polymers and blends of the invention are very particularly useful as electroluminescence materials in PLEDs or displays produced in this way.

For the purposes of the invention, electroluminescence materials are materials which can be used as active layer in a PLED. Active layer means that the layer is capable of emitting light on application of an electric field (light-emitting layer), and/or that it improves the injection and/or transport of the positive and/or negative charges (charge injection layer or charge transport layer).

The invention therefore also provides for the use of a polymer or blend according to the invention in a PLED, in particular as electroluminescence material.

The invention thus likewise provides a PLED comprising one or more active layers, wherein at least one of these active layers comprises one or more polymers and/or blends according to the invention. The active layer can, for example, be a light-emitting layer and/or a transport layer and/or a charge injection layer.

PLEDs are employed, for example, as self-illuminating display elements such as control lamps, alphanumeric displays, multi-color or full-color displays, information signs and in opto-electronic couplers.

The present patent application and also the further examples below are directed at the use of polymers or blends according to the invention in PLEDs and the corresponding displays.

Despite this restriction of the description, a person skilled in the art will readily be able, without having to make a further inventive step, to utilize the polymers or blends according to the invention for further applications in other electronic devices, e.g. for organic integrated circuits (O-ICs), in organic field effect transistors (OFETs), in organic thin film transistors (OTFTs), for organic solar cells (O-SCs), nonlinear optics or organic laser diodes (O-lasers), to name only a few applications. In the case of O-ICs and OFETs in particular, it is possible to use appropriate polymers according to the invention which have a relatively high proportion of structural elements of the formula (I) (preferably a proportion of more than 20 mol %).

The invention is illustrated by the following examples without being restricted thereby.

EXAMPLES

Part A: Synthesis of the Monomers and Blend Constituents:

A1: Monomers for Units of the Formula (I)

3,6-Dibromocarbazole and 2,7-dibromocarbazole were synthesized as described by Smith et al., *Tetrahedron* 1992, 48, 7479-7488, and Tidwell et al., *Eur. J. Med. Chem.* 1997, 32, 781-793. 3,6-Dibromo-N-ethylhexylcarbazole (=EHC) were synthesized as described by J. Huang et al., *Macromolecules* 2002, 35, 6080-6082.

The structural integrity of all products was demonstrated by means of $^1$H NMR spectroscopy, and the purity of the products was determined by means of HPLC.

Example 1

N-(4-tert-Butylphenyl)-3,6-dibromocarbazole (EM1)

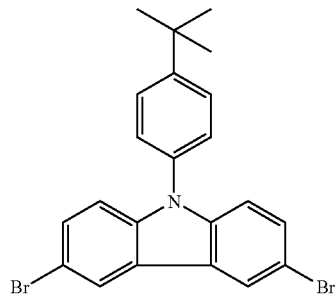

A degassed solution of 17 g (80 mmol) of 1-bromo-4-tert-butyl-benzene in 1500 ml of xylene was saturated with $N_2$ for 1 hour. The solution was subsequently admixed with 500 g of glass spheres (6 mm) and 15.37 g (160 mmol) of $K_3PO_4$ and was stirred for another 15 minutes. After stirring for 5 minutes, the reaction mixture was admixed with 90 mg (0.4 mmol) of palladium(II) acetate, 400 mg (2 mmol) of P(t-Bu)$_3$ and 10 g (60 mmol) of carbazole. The reaction mixture was refluxed for 4 hours. After cooling, the solvent was removed under reduced pressure and the product was recrystallized from n-hexane. Purity according to HPLC: 99.6%. Yield: 13 g (68%).

$^1$H-NMR (CDCl$_3$, 500 MHz): 1.42 (s, 9 H), 7.26 (t, $J_3$=7.7 Hz, 2 H), 7.40 (m, 4 H), 7.48 (d, J=8.7 Hz, 2 H), 7.59 (d, J=8.7 Hz, 2 H), 8.14 (d, J=8 Hz, 2 H).

12 g (40 mmol) of N-(4-tert-butylphenyl)carbazole and 70 g of silica gel together with 700 ml of CH$_2$Cl$_2$ were placed in a reaction vessel. 13 g (80 mmol) of NBS were subsequently added a little at a time to the solution at 0° C. while protecting it from light and the mixture was stirred at this temperature for 2 hours. The mixture was admixed with 100 ml of water and extracted with CH$_2$Cl$_2$. The organic phase was dried over MgSO$_4$ and the solvent was removed under reduced pressure. The product was stirred with hot hexane and filtered. Yield: 11 g (66%) of colorless powder which had an HPLC purity of 99.2%.

$^1$H-NMR (CDCl$_3$, 500 MHz): 1.42 (s, 9 H), 7.25 (d, J=8.7 Hz, 2 H), 7.39 (d, J=8.3 Hz, 2 H), 7.48 (dd, $J_3$=8.7 Hz, $J_4$=2 Hz, 2 H), 7.61 (d, J=8.7 Hz, 2 H), 8.18 (d, $J_4$=8 Hz, 2 H).

Example 2

N-(4-tert-Butylphenyl)-2,7-dibromocarbazole (EM2)

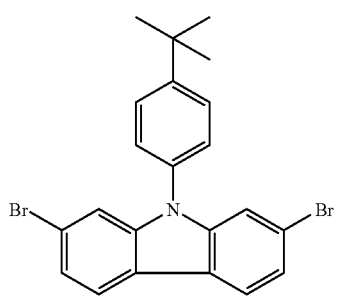

A degassed solution of 489.5 mg (0.156%) of copper(I) chloride and 906 mg (1% mmol) of 1,10-phenanthroline in 100 ml of toluene were saturated with $N_2$ for 1 hour and heated to 130° C. The solution was subsequently admixed with 16.2 g (50 mmol) of 2,7-dibromocarbazole and 13.2 g (50 mmol) of 1-iodo-4-tert-butylbenzene and heated at 180° C. for 2 hours. After cooling, the mixture was admixed with 180 ml of water, the organic phase was separated off and the solvent was removed under reduced pressure. The product was recrystallized from n-hexane. Yield: 13 g (59%). Purity according to HPLC: 99.5%

$^1$H-NMR (CDCl$_3$, 500 MHz): 1.43 (s, 9 H), 7.21 (t, J=7.7 Hz, 2 H), 7.23 (t, J=7.7 Hz, 2 H), 7.32 (dd, J$_3$=8.7 Hz, J$_4$=1.6 Hz, 2 H), 7.50, (d, J$_4$=1.6 Hz, 2 H), 7.89 (d, J=8.7 Hz, 2 H).

Example 3

N-(4-tert-Butylphenyl)methyl-3,6-dibromocarbazole (EM3)

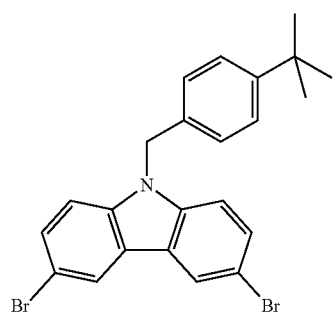

In a 250 ml one-neck flask provided with a reflux condenser, 990 mg (41.2 mmol) of NaH were suspended in 80 ml of dry DMF under protective gas. 10 g (30.8 mmol) of 3,6-dibromocarbazole in 80 ml of DMF were added dropwise to this reaction mixture at RT over a period of 20 minutes. A solution of 4-(tert-butyl)-benzyl bromide in 50 ml of DMF was subsequently added dropwise and the mixture was heated at 60° C. for 8 hours. After cooling to room temperature, 300 ml of water and 200 ml of ethyl acetate were carefully added. The organic phase was washed with 4×50 ml of H$_2$O, then dried over MgSO$_4$ and the solvents were removed under reduced pressure. The pure product was obtained by recrystallization from n-hexane. Yield: 11 g (78%); HPLC purity: 99.4%.

$^1$H-NMR (CDCl$_3$, 500 MHz): 1.22 (s, 9 H), 5.42 (s, 2 H), 6.98 (d, J=8.7 Hz, 2 H), 7.22 (d, J=8.7 Hz, 2 H), 7.26 (d, J=8.4 Hz, 2 H), 7.50 (dd, J$_3$=8.4 Hz, J$_4$=2 Hz, 2 H), 8.14 (d, J$_4$=2 Hz, 2 H)

Example 4

N-(4-tert-Butylphenyl)methyl-2,7-dibromocarbazole (EM4)

The synthesis was carried out using a method analogous to example 3, starting from 2,7-dibromocarbazole. The yield was 94%.

$^1$H-NMR (CDCl$_3$, 500 MHz): 1.21 (s, 9 H), 5.41 (s, 2 H), 6.97 (d, J=8.7 Hz, 2 H), 7.23 (d, J=8.7 Hz, 2 H), 7.33 (dd, J$_3$=8.7 Hz, J$_4$=1.6 Hz, 2 H), 7.51 (d, J$_4$=1.6 Hz, 2 H), 7.88 (d, J=8.7 Hz, 2 H).

Example 5

N-(4-tert-Butylphenyl)carbazole-3,6-biscarbaldehyde (EM5)

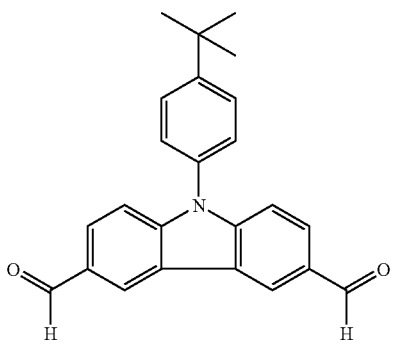

In a 250 ml three-necked flask, 32 mmol of EM1 were dissolved in 100 ml of dry THF under protective gas. After cooling to −78° C., precooled BuLi (80 mmol, 15% strength) was injected into the solution via a septum while stirring. Cooling was maintained and after 2 hours 5.2 ml of DMF were added dropwise at −60° C. The mixture was allowed to warm to RT and stirring was continued overnight. 200 ml of ice water were subsequently added carefully and the mixture was extracted with chloroform. The organic phase was dried over MgSO$_4$ and the solvents were removed under reduced pressure. The pure product was obtained by recrystallization from n-hexane. Yield: 8 g (68%). Purity according to HPLC: 99.1%

$^1$H-NMR (CDCl$_3$, 500 MHz): 1.34 (s, 9 H), 6.38 (d, J=8.1 Hz, 2 H), 6.82 (d, J=8.7 Hz, 2 H), 7.04 (d, J=8.1 Hz, 2 H), 7.18 (d, J=8.7 Hz, 2 H), 7.31 (d, J=8.7 Hz, 2 H), 9.2 (s, 2 H).

Example 6

3,6-Bis[2-(4-bromophenyl)ethenyl]-N-(4-tert-butyl-phenyl)carbazole (EM6)

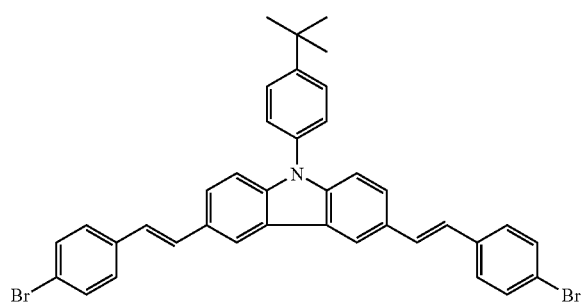

32 mmol of diethyl 4-bromobenzylphosphonate were dissolved in 90 ml of dry DMF under protective gas and cooled to 5° C. 60 mmol of NaO$^t$Bu were subsequently added in small portions, with the temperature not rising above 5° C. After 30 minutes, 14.7 mmol of EM5 in 25 ml of DMF were added dropwise at 5° C. and the mixture was stirred for a further 30 minutes at this temperature. The reaction mixture was cooled, 25 ml of 4M HCl were added dropwise and the precipitate was filtered off with suction. 100 ml of water were subsequently added carefully and the mixture was extracted with CH$_2$Cl$_2$. The organic phase was dried over MgSO$_4$ and the solvents were removed under reduced pressure. The pure product was obtained by recrystallization from ethyl acetate/CH$_2$Cl$_2$ mixture (1:1). Yield: 79 g (90%). Purity according to HPLC: 99.6%

$^1$H-NMR (CDCl$_3$, 500 MHz): 1.33 (s, 9 H), 6.34 (d, J=8.1 Hz, 2 H), 7.02 (d, J=8.1 Hz, 2 H), 7.08 (d, J=16.4 Hz, 2 H), 7.30 (d, J=16.4 Hz, 2 H), 7.37 (d, J=8.3 Hz, 2 H), 7.41 (d, J=8.3 Hz, 4 H), 7.48 (d, J=8.3 Hz, 4 H), 7.64 (dd, J$_3$=8.3 Hz, J$_4$=1.6 Hz, 2 H), 8.23 (d, J$_4$=1.6 Hz, 2 H).

Further monomers of the formula (I) or the formulae (II) to (XXXI) were synthesized by methods analogous to the abovementioned examples.

A2: Monomers for Further Units

The synthesis of the further monomers M1 to M23 has been described in detail in WO 02/077060 and the references cited therein. The monomers are shown once again below so as to give a better overview:

M1

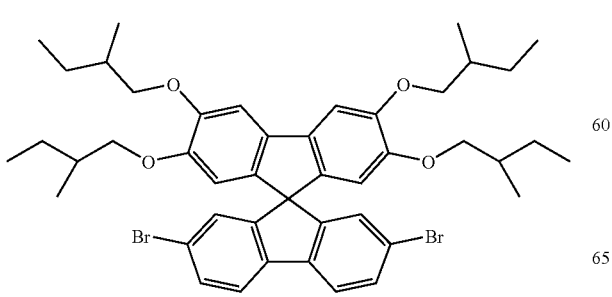

-continued

M2

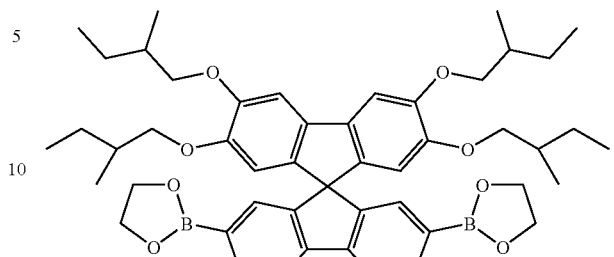

M3

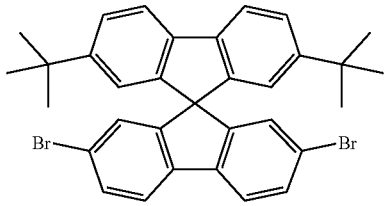

M4

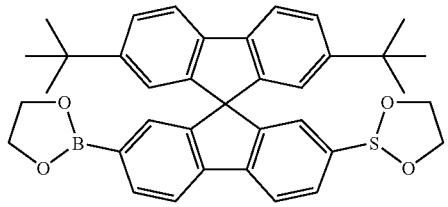

M5

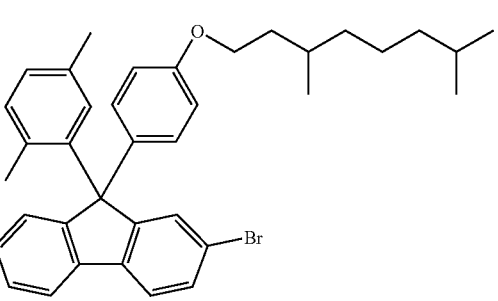

M6

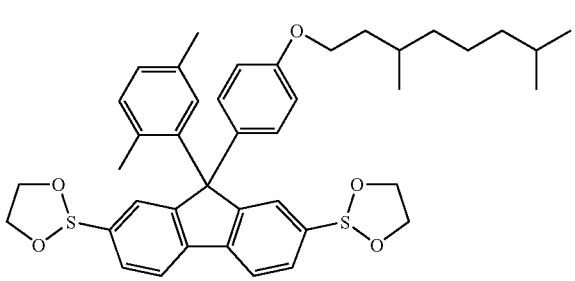

M7

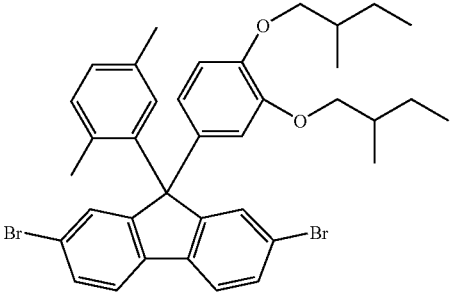

-continued
M8
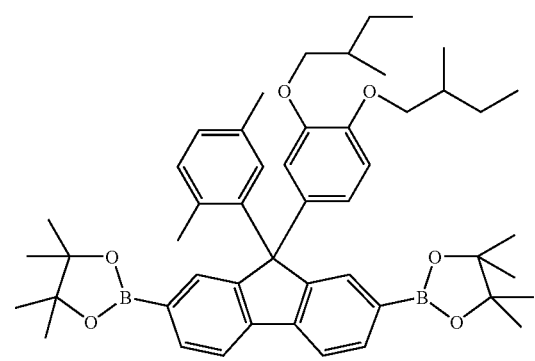
M9
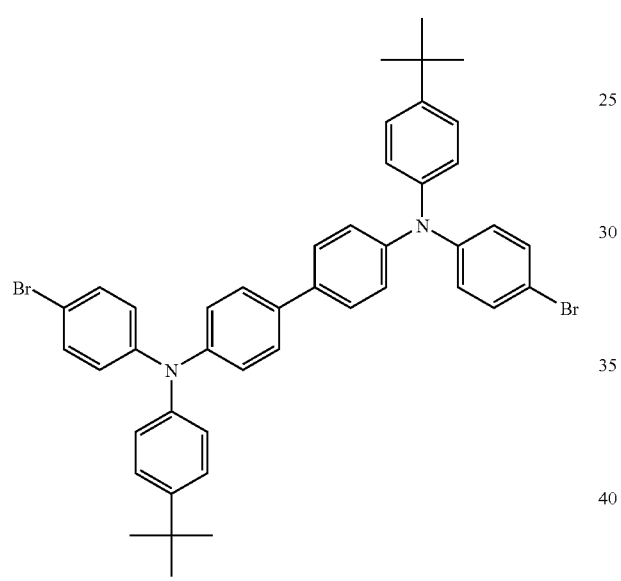
M10
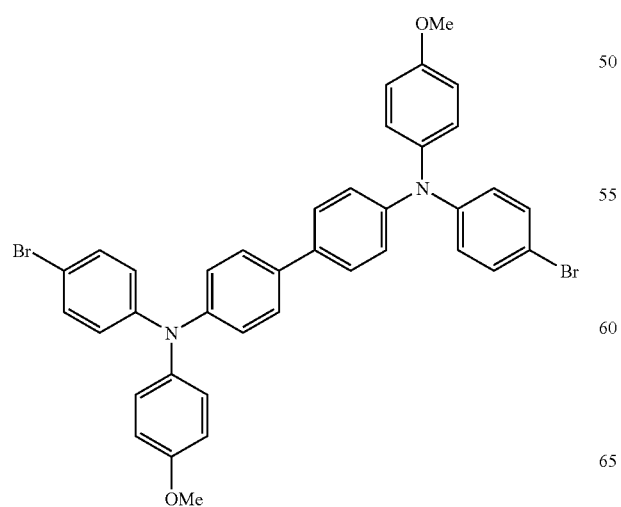
-continued
M11
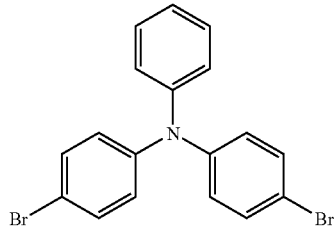
M12
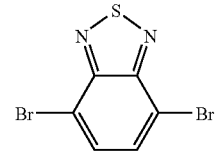
M13
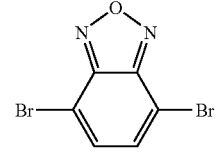
M14
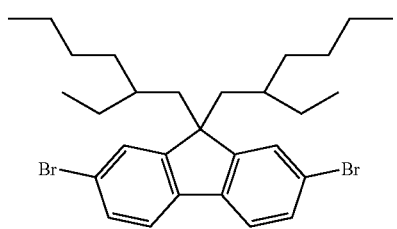
M15
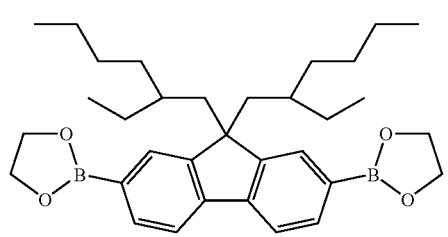
M16
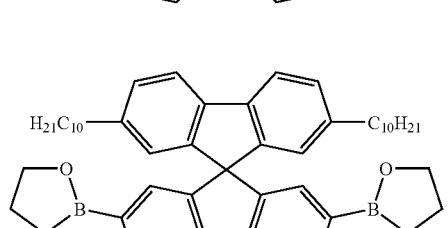
M17
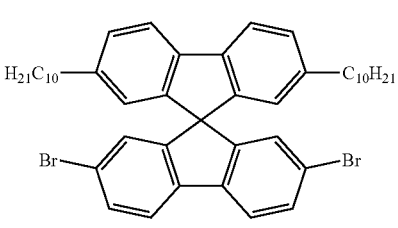

-continued

M18
M19
M20
M21
M22
M23

A3: Low Molecular Weight Compounds for Use in Blends

The low molecular weight compounds used here by way of example in blends according to the invention are, for example, soluble derivatives of tris(phenylpyridyl)iridium (III). The synthesis of these compounds has been described in the patent application WO 02/081488 and in the unpublished patent application DE 10238903.9. However, it will be clearly stated once more at this point that the blends according to the invention are not restricted to these low molecular weight compounds used here, but the nonpolymeric components can be the compounds COMP1 specified in more detail above. To give an overview, the two iridium complexes used here by way of example are shown once more below:

Ir1

-continued

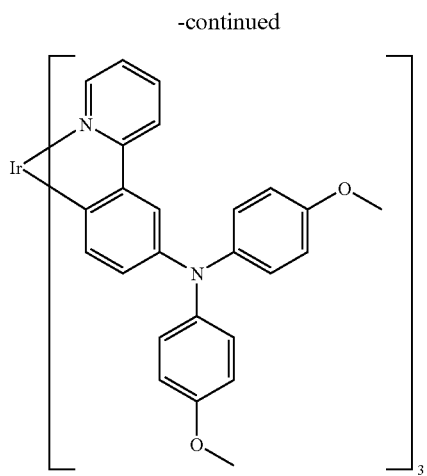

Part B: Preparation of the Polymers and Blends

Synthesis of Polymer P1

3.2026 g (4 mmol) of monomer M2, 1.6237 g (2.4 mmol) of monomer M7, 0.6069 g (0.8 mmol) of monomer M9, 0.3770 g (0.8 mmol) of EM1 and 3.91 g (2.125 equivalents) of potassium phosphate hydrate were dissolved in 37.5 ml of dioxane, 12.5 ml of toluene and 6.8 ml of $H_2O$ (all solvents oxygen-free). The reaction solution was degassed by means of argon for 30 minutes at 40° C. 0.45 mg (0.025%) of $Pd(OAc)_2$ and 3.65 mg (0.15%) of $P(o\text{-tolyl})_3$ were then added as catalyst and the solution was refluxed under an argon atmosphere for 1.5 hours. The highly viscous polymer solution was diluted with 20 ml of toluene. The end-capping was then carried out by adding 100 mg of benzene-boronic acid, refluxing for 45 minutes, then adding 0.2 ml of bromobenzene and refluxing for a further 45 minutes. The polymer solution was stirred with 100 ml of 0.01% strength aqueous NaCN solution at 60° C for 3 hours. The phases were then separated and the organic phase was washed with 4×100 ml of $H_2O$. The polymer was precipitated by addition of twice the volume of methanol and filtered. Further purification was effected by dissolution in 200 ml of toluene at 60° C. under argon, filtration through a glass frit and renewed precipitation by addition of twice the volume of methanol. The polymer was filtered off and dried under reduced pressure. 4.85 g (96% of theory) of polymer were isolated; $M_w$=578 000, $M_n$=156 000, polydispersity=3.7.

Synthesis of Polymer P2

The polymer was synthesized by a method analogous to that for polymer P1 using 3.2026 g (4 mmol) of monomer M2, 1.0825 g (1.6 mmol) of monomer M7, 0.6069 g (0.8 mmol) of monomer M9, 0.8185 g (0.8 mmol) of monomer M19, 0.3658 g (0.8 mmol) of EM4 and 3.91 g (2.125 equivalents) of potassium phosphate hydrate in 25 ml of dioxane, 25 ml of toluene and 6.8 ml of $H_2O$. 4.57 g (92% of theory) of polymer were isolated $M_w$=791 000, $M_n$=239 000, polydispersity=3.3.

Further polymers were prepared by methods analogous to that described for P1. The chemical properties are summarized in table 1. Some comparative polymers (which do not contain any units of the formula (I)) were also prepared. These, too, are shown in the table.

Preparation of the Blends

The blends are synthesized by dissolving the polymer together with the dendrimer or the low molecular weight compound in the desired ratio in a suitable solvent such as toluene, xylene, THF, chlorobenzene or anisole and processing the solution directly without isolation of the blend in solid form. All polymers and blends were also examined for use in PLEDs. The way in which PLEDs can be produced has firstly been mentioned above and is described in part C.

Some device properties (color, efficiency and operating voltage) are also shown in table 1.

The current-voltage characteristics of some polymers are documented in table 2 and FIG. 1. It can readily be seen here that the curves rise significantly more steeply in the case of the polymers according to the invention and the current at a given voltage is significantly higher in the case of the polymers and blends according to the invention than in the case of the comparative polymers or blends comprising unconjugated polymers with low molecular weight compounds according to the prior art.

In table 3, some device properties (color, efficiency and operating voltage) of blends according to the invention are shown and compared with blends corresponding to the prior art.

TABLE 1

| Polymer (type)* | Proportion of monomers in the polymerization [%] | | | | GPC** | | Electroluminescence*** | | | | Visco.***** |
|---|---|---|---|---|---|---|---|---|---|---|---|
| | Monom. 1 | Monom. 2 | Monom. 3 (+possibly mono. 4) | EM | $M_w$ (·1000 g/mol) | $M_n$ (·1000 g/mol) | $\lambda_{max}$ [nm] | Max. eff [Cd/A] | Voltage at 100 Cd/m² [V] | CIE coordinates**** (x/y) | Gel temp. [° C.] |
| P1 (S) | 50% of M2 | 30% of M7 | 10% of M9 | 10% of EM1 | 578 | 156 | 449 | 3.10 | 4.7 | 0.15/0.12 | <0° C. |
| P2 (S) | 50% of M2 | 20% of M7 | 10% of M9, 10% of M19 | 10% of EM4 | 791 | 239 | 455/482 | 2.12 | 5.8 | 0.18/0.25 | <0° C. |
| P3 (S) | 50% of M2 | 40% of M1 | | 10% of EM2 | 624 | 132 | 433/449 | 2.25 | 4.4 | 0.16/0.10 | <0° C. |
| P4 (S) | 50% of M2 | | | 50% of EM3 | 298 | 61 | 427 | 1.24 | 7.9 | 0.16/0.06 | |
| P5 (S) | 50% of M2 | 30% of M7 | 10% of M19 | 10% of EM3 | 824 | 204 | 454/481 | 5.06 | 3.6 | 0.17/0.25 | <0° C. |
| P6 (S)[a] | 50% of M2 | | | 50% of EHC[b] | 298 | 61 | | | | | |

TABLE 1-continued

| Polymer (type)* | Monom. 1 | Monom. 2 | Monom. 3 (+possibly mono. 4) | EM | GPC** M$_w$ (·1000 g/mol) | M$_n$ (·1000 g/mol) | Electroluminescence*** $\lambda_{max}$ [nm] | Max. eff [Cd/A] | Voltage at 100 Cd/m$^2$ [V] | CIE coordinates**** (x/y) | Visco.***** Gel temp. [° C.] |
|---|---|---|---|---|---|---|---|---|---|---|---|
| P7 (S)$^a$ | 50% of M2 | | | 50% of EM1 | 308 | 79 | | | | | |
| P8 (S)$^a$ | 50% of M2 | 40% of M1 | | 10% of EHC$^b$ | 764 | 200 | | | | | |
| P9 (S)$^a$ | 50% of M2 | 10% of M1 | 10% of M9 | 30% of EHC$^b$ | 350 | 114 | | | | | |
| C1 (S) | 50% of M2 | 40% of M7 | 10% of M9 | | 1190 | 199 | 464 | 3.42 | 4.9 | 0.16/0.17 | <0° C. |
| C2 (S) | 50% of M2 | 30% of M7 | 10% of M9, 10% of M19 | | 464 | 126 | 459/484 | 5.31 | 4.2 | 0.18/0.29 | <0° C. |
| C3 (S) | 50% of M2 | 50% of M1 | | | 207 | 63 | 433/449 | 1.38 | 4.8 | 0.16/0.11 | <0° C. |
| C4 (S) | 50% of M2 | 40% of M7 | 10% of M19 | | 520 | 170 | 461/483 | 3.99 | 4.1 | 0.16/0.25 | <0° C. |

*S = Prepared by Suzuki polymerization (cf. ex. P1), Y = prepared by Yamamoto polymerization
**GPC measurements in THF; 1 ml/min, Plgel 10 μm Mixed-B 2 × 300 × 7.5 mm$^2$, 35° C., RI detection was calibrated against polystyrene
***For production of the polymer LEDs, see part C
****CIE coordinates: chromaticity coordinates of the Commission Internationale de l'Eclairage
*****Solutions of the polymer (10 mg/ml) in toluene were heated to 60° C., cooled at 1° C./minute and the viscosity was measured in a Brookfield LVDV-III rheometer (CP-41). A sharp increase in viscosity occurs at the gel temperature determined in this way.
$^a$Polymer P6 to polymer P9 were examined only in blends with triplet emitters (cf. table 3).
$^b$EHC = 3,6-dibromo-N-ethylhexylcarbazole

TABLE 2

| Polymer | Current density (mA/cm$^2$) at a voltage of | | | | |
|---|---|---|---|---|---|
| | 2 V | 3 V | 4 V | 5 V | 6 V |
| P5 | 0 | 0.3 | 4.6 | 18.3 | 51.7 |
| C2 | 0 | 0.2 | 2.6 | 12.3 | 38.0 |
| C4 | 0 | 0.1 | 1.7 | 6.5 | 16.4 |

Comparison of the current at different voltages (for the example of a polymer according to the invention and two polymers which have a similar composition but do not contain any structural units of the formula (I)).

FIG. 1 shows a comparison of the current-voltage curves for the polymer P5 according to the invention (containing 10% of carbazole) with the comparative polymer C2 (containing 10% of the hole conductor M9 but no carbazole) and the comparative polymer C4 (containing no other hole conductor nor any carbazole).

TABLE 3

| Blend | Polymer | Blend composition Iridium complex | Proportion of Ir complex [%] | Electroluminescence* $\lambda_{max}$ [nm] | Max. eff. [cd/A] | Voltage at 100 Cd/m$^2$ [V] | CIE1931 coordinates** (x/y) |
|---|---|---|---|---|---|---|---|
| B1 | P5 | Ir1 | 8 | 534 | 9.29 | 5.90 | 0.40/0.58 |
| B2 | P5 | Ir2 | 8 | 604 | 6.22 | 10.62 | 0.59/0.41 |
| B3 | P6 | Ir1 | 8 | 532 | 9.23 | 5.88 | 0.38/0.60 |
| B4 | P7 | Ir1 | 8 | 532 | 12.82 | 6.92 | 0.38/0.60 |
| B5 | P7 | Ir1 | 20 | 532 | 14.49 | 5.87 | 0.38/0.60 |
| B6 | P6 | Ir2 | 8 | 604 | 6.27 | 10.60 | 0.50/0.61 |
| B7 | P8 | Ir2 | 8 | 611 | 4.42 | 6.41 | 0.62/0.38 |
| B8 | P8 | Ir2 | 20 | 614 | 7.53 | 4.35 | 0.62/0.38 |
| B9 | P9 | Ir2 | 8 | 606 | 6.62 | 6.91 | 0.60/0.40 |
| CB1 | C3 | Ir1 | 8 | 529 | 0.65 | 6.33 | 0.36/0.55 |
| CB2 | C3 | Ir2 | 8 | 605 | 0.40 | 6.70 | 0.60/0.39 |
| CB3 | PVK*** | Ir1 | 8 | 520 | 7.13 | 13.71 | 0.37/0.60 |
| CB4 | PVK*** | Ir2 | 8 | 600 | 3.64 | 13.41 | 0.58/0.42 |

*For the production of the polymer LEDs, see part C
**CIE coordinates: chromaticity coordinates of the Commission Internationale de l'Eclairage of 1931
***PVK = poly(vinylcarbazole)

Part C: Production and Characterization of LEDs:

All polymers and blends were examined for use in PLEDs. These PLEDs were in each case two-layer systems, i.e. substrate//ITO//PEDOT//polymer//cathode. PEDOT is a polythiophene derivative (Baytron P from H. C. Stark, Goslar). As cathode, Ba/Ag (both from Aldrich) was used in all cases. The way in which PLEDs can be produced is described in detail in DE 10249723.0 and the references cited therein.

The invention claimed is:

1. A conjugated polymer (POLY1), characterized in that it comprises 1-100 mol % of units of the formula (I),

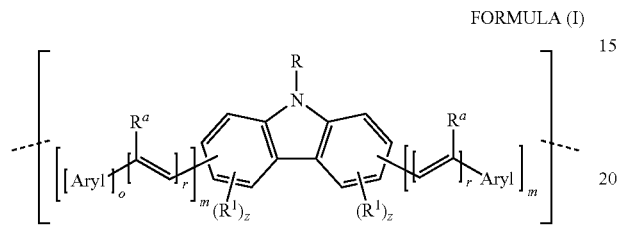

FORMULA (I)

where the symbols and indices have the following meanings:

R is identical or different on each occurrence and is a cycloalkyl system which has from 3 to 40 carbon atoms and may be substituted or unsubstituted, an aromatic or heteroaromatic ring system which has from 2 to 40 carbon atoms and may be substituted or unsubstituted or an alkylenearyl, alkylenecycloalkyl or alkyleneheteroaryl system which has a linear or branched alkylene chain having from 1 to 16 carbon atoms and may be substituted or unsubstituted; the aryl, heteroaryl and cycloalkyl systems can also be part of a larger fused aromatic or aliphatic ring system; the possible substituents $R^1$ can potentially be located on each free position;

Aryl are identical or different on each occurrence and are each an aromatic or heteroaromatic ring system which has from 2 to 40 carbon atoms and may be substituted or unsubstituted or a substituted or unsubstituted stilbenylene or tolanylene unit; the possible substituents $R^1$ can potentially be located on each free position;

$R^1$ is identical or different on each occurrence and is a straight-chain, branched or cyclic alkyl or alkoxy chain which has from 1 to 22 carbon atoms and in which one or more nonadjacent carbon atoms may also be replaced by $N-R^2$, O, S, —CO—O—, O—CO—O, where one or more H atoms may also be replaced by fluorine, an aryl or aryloxy group which has from 5 to 40 carbon atoms and in which one or more carbon atoms may also be replaced by O, S or N which may also be substituted by one or more nonaromatic radicals $R^1$, or Cl, F, CN, $N(R^2)_2$, $B(R^2)_2$, where two or more radicals $R^1$ may also together form a ring system;

$R^a$ is identical or different on each occurrence and is a straight-chain, branched or cyclic alkyl or alkoxy chain which has from 1 to 22 carbon atoms and in which one or more nonadjacent carbon atoms may also be replaced by $N-R^2$, O, S, —CO—O—, O—CO—O, where one or more H atoms may also be replaced by fluorine, an aryl or aryloxy group which has from 5 to 40 carbon atoms and in which one or more carbon atoms may also be replaced by O, S or N which may also be substituted by one or more nonaromatic radicals $R^1$, or Cl, F, CN, $N(R^2)_2$, $B(R^2)_2$;

$R^2$ is identical or different on each occurrence and is H, a straight-chain, branched or cyclic alkyl chain which has from 1 to 22 carbon atoms and in which one or more nonadjacent carbon atoms may also be replaced by O, S, —CO—O—, O—CO—O, where one or more H atoms may also be replaced by fluorine, an aryl group which has from 5 to 40 carbon atoms and in which one or more carbon atoms may also be replaced by O, S or N which may also be substituted by one or more nonaromatic radicals $R^1$;

m is identical or different on each occurrence and is 0, 1 or 2;

o is identical or different on each occurrence and is 0, 1 or 2, with the proviso that o must not be 0 when m=2;

r is identical or different on each occurrence and is 0 or 1, z is identical or different on each occurrence and is 0, 1, 2 or 3;

the open-line bond indicates the linkage in the polymer; it should in the present case not be a methyl group and wherein formula (I) represents a bifunctional molecule if present within the polymer chain or a monofunctional molecule if present at the end of a polymer chain and the polymers have from 50 to 10,000 repeating units and a number average molecular weight (Mn) of at least 61,000.

2. The polymer as claimed in claim 1, characterized in that the units of the formula (I) are bound into the side chain of the polymer and are linked via position 2 or position 3 of the carbazole to the main chain of the polymer.

3. The polymer as claimed in claim 1, characterized in that the structural units of the formula (I) are incorporated into the main polymer chain via the positions 3 and 6 or the positions 2 and 7 of the carbazole.

4. The polymer as claimed in claim 1, characterized in that the structural units of the formula (I) are incorporated into the polymer chain via the positions 3 and 9 of the carbazole or via the positions 2 and 9 of the carbazole if R is an aryl or heteroaryl system so that the conjugation of the chain is maintained.

5. The polymer as claimed in claim 1, wherein the polymer is a copolymer and further structural elements are present.

6. The polymer as claimed in claim 5, characterized in that the further structural elements are ortho-, meta- or para-phenylenes, 1,4-naphthylenes, 9,10-anthracenylenes, 2,7-phenanthrenylenes, 1,6- or 2,7- or 4,9-pyrenylenes or 2,7-tetrahydropyrenylenes, oxadiazolylenes, 2,5-thiophenylenes, 2,5-pyrrolylenes, 2,5-furanylenes, 2,5-pyridylenes, 2,5-pyrimidinylenes, 5,8-quinolinylenes, fluorenes, spiro-9,9'-bifluorenes, indenefluorenes and indenofluorenes or heteroindenofluorenes.

7. The polymer as claimed in claim 5, characterized in that further structural elements which improve charge transport and/or charge injection are present.

8. The polymer as claimed in claim 7, characterized in that the further structural elements are selected from the groups of triarylamines or oxadiazolylenes.

9. The polymer as claimed in claim 5, characterized in that the further structural elements are selected from groups which shift the color of the emission, thus also alter the band gap of the polymer and the charge injection properties or charge transport properties.

10. The polymer as claimed in claim 9, characterized in that the further structural elements are selected from the groups of arylene-vinylene or arylene-acetylene structures and/or larger aromatic units.

11. The polymer as claimed in claim 5, characterized in that it comprises metal complexes which make transfer of singlet excitons to triplet excitons possible and which emit light from the triplet state.

12. The polymer as claimed in claim 11, characterized in that the metal complexes contain d and f transition metals.

13. The polymer as claimed in claim 12, characterized in that the metal complexes contain metals of groups 8 to 10.

14. The polymer as claimed in claim 1, characterized in that the following applies to the symbols and indices:
R is identical or different on each occurrence and is an aromatic or heteroaromatic ring system selected from among thiophene, benzothiophene, benzene, naphthalene, anthracene and phenanthrene which are unsubstituted or substituted by a substituent $R^1$, or a benzyl ring system whose phenyl group has the same substitution pattern as the abovementioned systems;
Aryl is identical or different on each occurrence and is an aromatic or heteroaromatic ring system selected from among thiophene, benzene, pyridine, fluorene, spirobifluorene, anthracene, phenanthrene, pyrene, quinoline and naphthalene which bears from 0 to 2 substituents $R^1$ on the free positions;
m is identical or different on each occurrence and is 0 or 1.

15. The polymer as claimed in claim 1, characterized in that at least two nonaromatic carbon atoms are present in the substituents on average per repeating unit.

16. The polymer as claimed in claim 1, characterized in that no substituents having more than 12 carbon atoms are present in a linear chain.

17. The polymer as claimed in claim 1, characterized in that it is prepared by SUZUKI coupling, YAMAMOTO coupling, STILLE coupling, HARTWIG-BUCHWALD coupling, the WITTIG-HORNER reaction or a precursor process.

18. A mixture of a polymer as claimed in claim 1 with further polymers.

19. An electronic component comprising one or more active layers, wherein at least one of these active layers comprises one or more polymers as claimed in claim 1.

20. An electronic component as claimed in claim 19, characterized in that it is an organic light-emitting diode.

21. The polymer as claimed in claim 1, wherein the polymer has 50 to 5,000 repeating units and a polydispersity of less than 10.

22. The polymer as claimed in claim 1, wherein the polymer has 50 to 2,000 repeating units and a polydispersity of less than 5.

23. A mixture comprising
(A) 5-99.5% by weight of the polymer as claimed in claim 1 and
(B) 0.5-95% by weight of at least one organic or organometallic dendrimer or at least one low molecular weight molecule having a molecular weight in the range <10 000 (COMP1) which in a pure or dilute film is capable of fluorescence or phosphorescence and which has adequate solubility in suitable solvents to be able to be processed in the blend together with the polymer from a solution in this solvent.

24. The blend as claimed in claim 23, wherein the component COMP1 of the blend comprises one or more metal complexes which make transfer of singlet excitons to triplet excitons possible and which emit light from the triplet state.

25. The mixture as claimed in claim 23, wherein the COMP1 contains at least one d and/or f transition metal.

26. The mixture as claimed in claim 25, wherein the COMP1 contains at least one transition metal from groups 8 to 10.

27. The mixture as claimed in claim 23, wherein POLY2 comprises 30-100 mol% of structural units of the formula (XXXII).

28. An organic integrated circuits (O-ICs), organic field effect transistors (OFETs), organic thin film transistors (OTFTs), organic solar cells (O-SCs) organic light-emitting diodes (OLEDs), organic laser diodes (O-lasers) or nonlinear optics which comprises the mixture as claimed in claim 23.

29. The polymer as claimed in claim 1, wherein the structural elements of the formula (I) are selected from among the formulae (II) to (XXXI) which may be substituted or unsubstituted

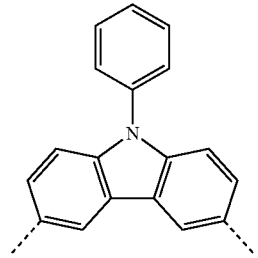

Formula (II)

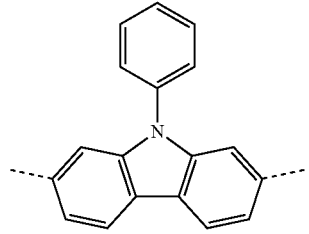

Formula (III)

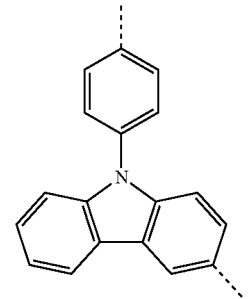

Formula (IV)

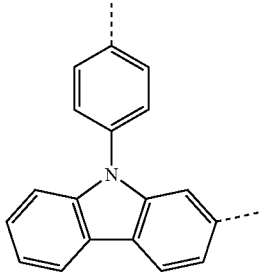

Formula (V)

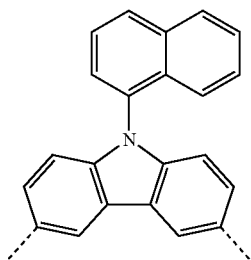

Formula (VI)

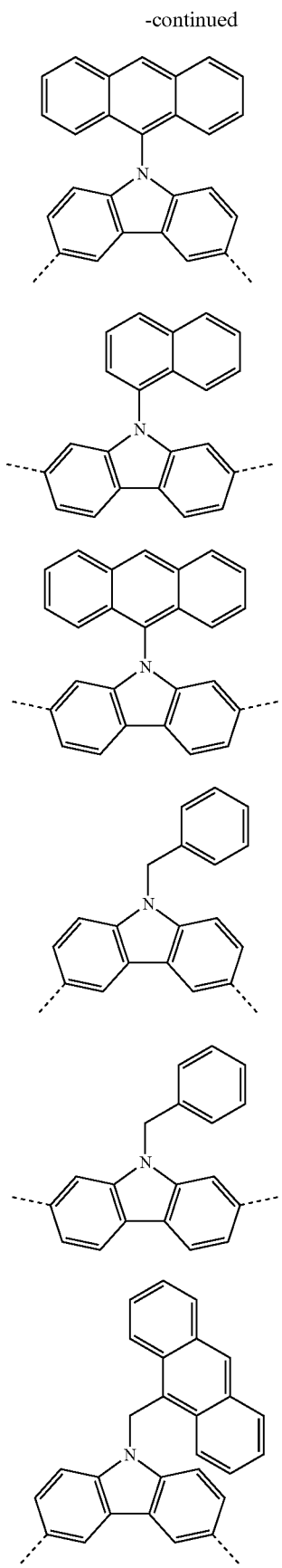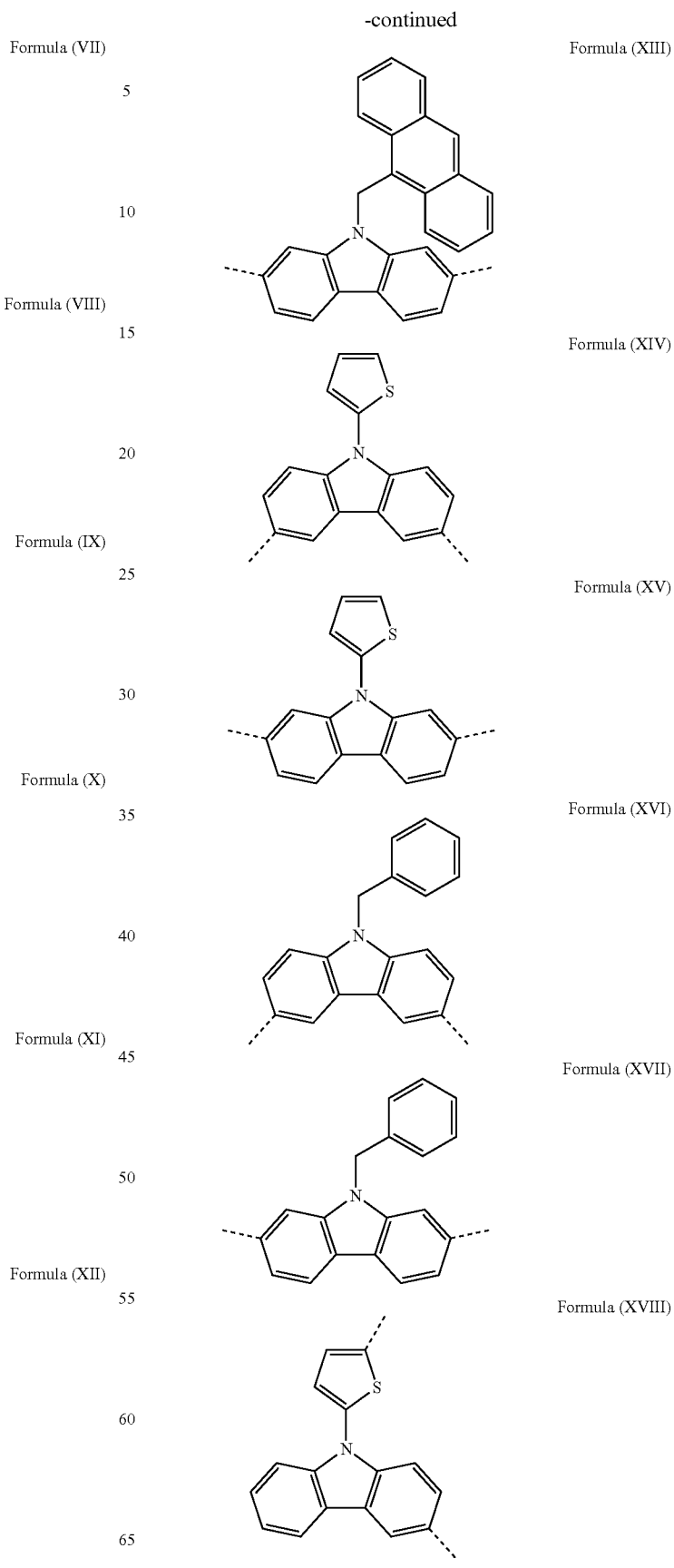

-continued
Formula (XIX)
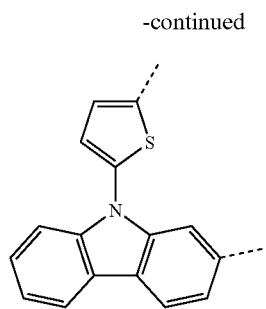
Formula (XX)
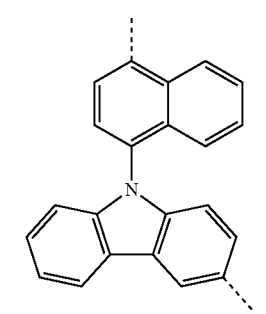
Formula (XXI)
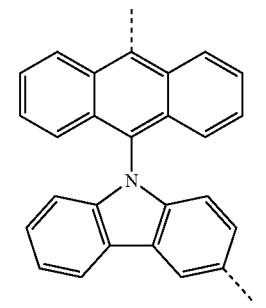
Formula (XXII)
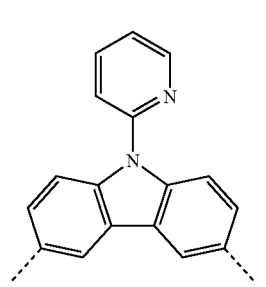
Formula (XXIII)
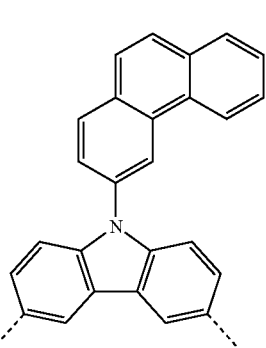
-continued
Formula (XXIV)
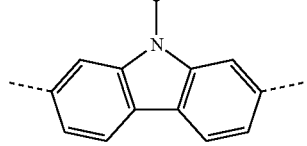
Formula (XXV)
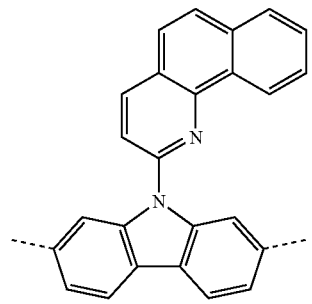
Formula (XXVI)
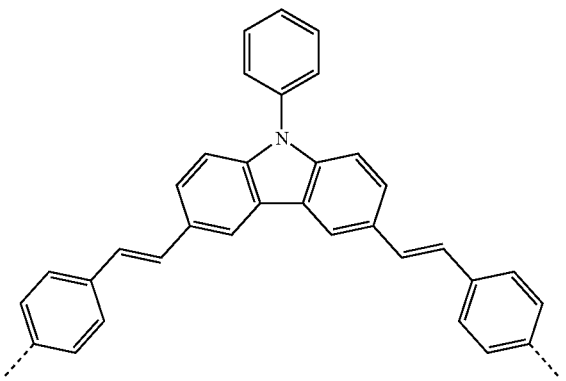
Formual (XXVII)
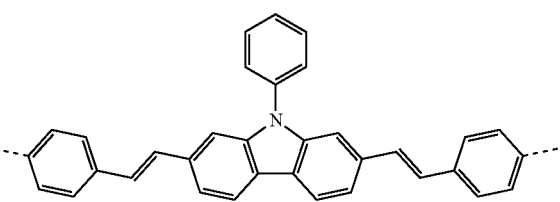
Formula (XXVIII)
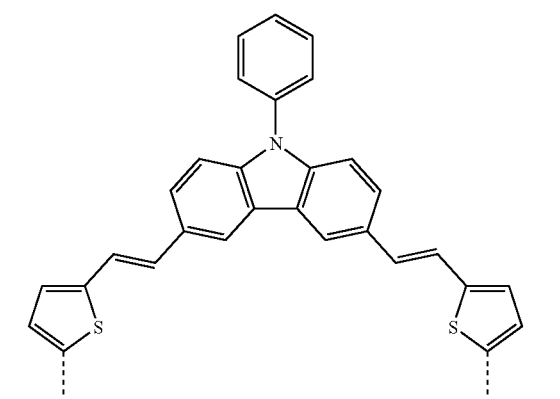

-continued

Formula (XXIX)

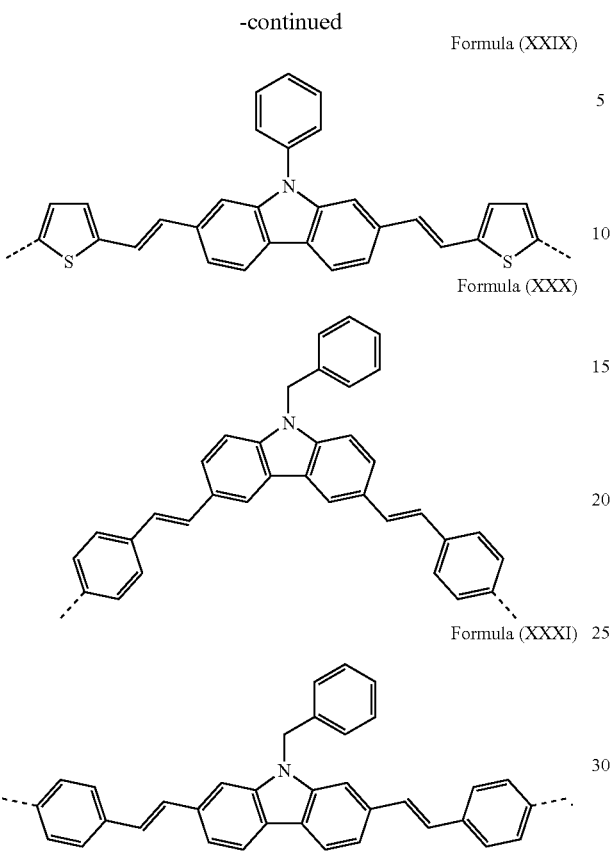

Formula (XXX)

Formula (XXXI)

30. The polymer as claimed in claim 1, wherein the structural elements of the formula (I) are in the main chain of the polymer.

31. The polymer as claimed in claim 1, wherein the structural elements of the formula (I) are in the side chain of the polymer.

32. A conjugated polymer (POLY1), wherein the polymer comprises 1-100 mol % of units of the formula (I),

FORMULA (I)

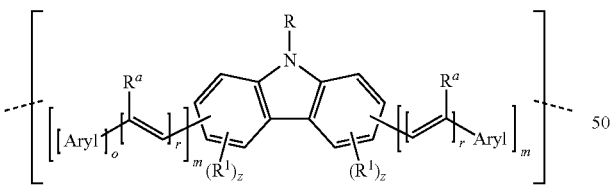

where the symbols and indices have the following meanings:

R is identical or different on each occurrence and is a cycloalkyl system which has from 3 to 40 carbon atoms and may be substituted or unsubstituted, an aromatic or heteroaromatic ring system which has from 2 to 40 carbon atoms and may be substituted or unsubstituted or an alkylenearyl, alkylenecycloalkyl or alkyleneheteroaryl system which has a linear or branched alkylene chain having from 1 to 16 carbon atoms and may be substituted or unsubstituted; the aryl, heteroaryl and cycloalkyl systems can also be part of a larger fused aromatic or aliphatic ring system; the possible substituents $R^1$ can potentially be located on each free position;

Aryl are identical or different on each occurrence and are each an aromatic or heteroaromatic ring system which has from 2 to 40 carbon atoms and may be substituted or unsubstituted or a substituted or unsubstituted stilbenylene or tolanylene unit; the possible substituents $R^1$ can potentially be located on each free position;

$R^1$ is identical or different on each occurrence and is a straight-chain, branched or cyclic alkyl or alkoxy chain which has from 1 to 22 carbon atoms and in which one or more nonadjacent carbon atoms may also be replaced by N—$R^2$, O, S, —CO—O—, O—CO—O, where one or more H atoms may also be replaced by fluorine, an aryl or aryloxy group which has from 5 to 40 carbon atoms and in which one or more carbon atoms may also be replaced by O, S or N which may also be substituted by one or more nonaromatic radicals $R^1$, or Cl, F, CN, $N(R^2)_2$, $B(R^2)_2$, where two or more radicals $R^1$ may also together form a ring system;

$R^a$ is identical or different on each occurrence and is a straight-chain, branched or cyclic alkyl or alkoxy chain which has from 1 to 22 carbon atoms and in which one or more nonadjacent carbon atoms may also be replaced by N—$R^2$, O, S, —CO—O—, O—CO—O, where one or more H atoms may also be replaced by fluorine, an aryl or aryloxy group which has from 5 to 40 carbon atoms and in which one or more carbon atoms may also be replaced by O, S or N which may also be substituted by one or more nonaromatic radicals $R^1$, or Cl, F, CN, $N(R^2)_2$, $B(R^2)_2$;

$R^2$ is identical or different on each occurrence and is H, a straight-chain, branched or cyclic alkyl chain which has from 1 to 22 carbon atoms and in which one or more nonadjacent carbon atoms may also be replaced by O, S, —CO—O—, O—CO—O, where one or more H atoms may also be replaced by fluorine, an aryl group which has from 5 to 40 carbon atoms and in which one or more carbon atoms may also be replaced by O, S or N which may also be substituted by one or more nonaromatic radicals $R^1$;

m is identical or different on each occurrence and is 0, 1 or 2;

o is identical or different on each occurrence and is 0, 1 or 2, with the proviso that o must not be 0 when m=2;

r is identical or different on each occurrence and is 0 or 1, z is identical or different on each occurrence and is 0, 1, 2 or 3;

the open-line bond indicates the linkage in the polymer; it should in the present case not be a methyl group and wherein formula (I) represents a bifunctional molecule if present within the polymer chain or a monofunctional molecule if present at the end of a polymer chain and the polymers have greater than 50 up to 5,000 repeating units.

33. The polymer as claimed in claim 1, wherein the polymer has from 50 to 5,000 repeat units.

34. The polymer as claimed in claim 1, wherein the polymer has a number average molecular weight (Mn) from 61,000 to 239,000.

35. The polymer as claimed in claim 32, wherein the polymer has a number average molecular weight (Mn) from 61,000 to 239,000.

36. The polymer as claimed in claim 1, wherein the polymer contains 1-50 mol % of units of the formula (I).

37. The polymer as claimed in claim 35, wherein the polymer contains 1-50 mol % of units of the formula (I).

* * * * *

UNITED STATES PATENT AND TRADEMARK OFFICE
CERTIFICATE OF CORRECTION

PATENT NO. : 7,834,136 B2  
APPLICATION NO. : 10/544437  
DATED : November 16, 2010  
INVENTOR(S) : Amir H. Parham et al.

Page 1 of 1

It is certified that error appears in the above-identified patent and that said Letters Patent is hereby corrected as shown below:

Title Page:
(73) Assignee: Change "Covion Organic Semiconductors GmbH, Wiesbaden (DE)" to --Merck Patent GmbH, Darmstadt (DE)--

Signed and Sealed this
Fifth Day of November, 2013

Teresa Stanek Rea
*Deputy Director of the United States Patent and Trademark Office*